United States Patent
Lee et al.

(10) Patent No.: US 12,484,419 B2
(45) Date of Patent: Nov. 25, 2025

(54) DISPLAY DEVICE WITH OPTICAL COMPENSATION LAYER OF LOW REFRACTIVE INDEX AND METHOD OF MANUFACTURING THE SAME

(71) Applicant: SAMSUNG DISPLAY CO., LTD., Yongin-si (KR)

(72) Inventors: Jeongseok Lee, Yongin-si (KR); Hyekyun Lee, Seoul (KR); Seunghun Kim, Hwaseong-si (KR); Woocheol Park, Asan-si (KR); Kwanhyuck Yoon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 422 days.

(21) Appl. No.: 18/061,019

(22) Filed: Dec. 2, 2022

(65) Prior Publication Data

US 2023/0232655 A1 Jul. 20, 2023

(30) Foreign Application Priority Data

Jan. 18, 2022 (KR) ........................ 10-2022-0007117

(51) Int. Cl.
*H10K 59/80* (2023.01)
*H10K 50/844* (2023.01)
*H10K 50/852* (2023.01)
*H10K 71/00* (2023.01)

(52) U.S. Cl.
CPC ......... *H10K 59/873* (2023.02); *H10K 50/852* (2023.02); *H10K 59/876* (2023.02); *H10K 71/00* (2023.02)

(58) Field of Classification Search
CPC ..... H10K 50/852; H10K 71/00; H10K 50/844
See application file for complete search history.

(56) References Cited

U.S. PATENT DOCUMENTS

| | | | |
|---|---|---|---|
| 9,431,634 B2 | 8/2016 | Song | |
| 2011/0163339 A1* | 7/2011 | Negishi | H10K 50/852 |
| | | | 977/755 |
| 2016/0155979 A1* | 6/2016 | Yim | H10K 59/879 |
| | | | 257/40 |
| 2016/0197308 A1* | 7/2016 | Jeong | H10K 50/852 |
| | | | 257/40 |
| 2019/0157358 A1* | 5/2019 | Maeda | H10K 59/879 |

(Continued)

FOREIGN PATENT DOCUMENTS

| | | |
|---|---|---|
| KR | 10-1502206 | 3/2015 |
| KR | 10-1864154 | 6/2018 |
| KR | 10-2019-0074859 | 6/2019 |

*Primary Examiner* — Michael Jung
(74) *Attorney, Agent, or Firm* — Chau & Associates, LLC

(57) ABSTRACT

A display device includes a display element layer including a first electrode layer, a light-emitting layer disposed on the first electrode layer, and a second electrode layer disposed on the light-emitting layer, a capping layer disposed on the second electrode layer, a protective layer disposed on the capping layer and covering a portion of the second electrode layer exposed by the capping layer, an optical compensation layer disposed on the protective layer, and an encapsulation layer disposed on the optical compensation layer. The refractive index of the optical compensation layer is lower than that of the protective layer.

27 Claims, 13 Drawing Sheets

(56) References Cited

U.S. PATENT DOCUMENTS

| | | | |
|---|---|---|---|
| 2023/0157084 A1* | 5/2023 | Roh | H10K 71/00 |
| | | | 257/40 |
| 2023/0189578 A1* | 6/2023 | Cha | H10K 59/1213 |
| | | | 257/40 |
| 2024/0188392 A1* | 6/2024 | Yao | H10K 50/858 |

* cited by examiner

DISPLAY DEVICE WITH OPTICAL COMPENSATION LAYER OF LOW REFRACTIVE INDEX AND METHOD OF MANUFACTURING THE SAME

CROSS-REFERENCE TO RELATED APPLICATIONS

This U.S. non-provisional patent application claims priority under 35 U.S.C. § 119 of Korean Patent Application No. 10-2022-0007117, filed on Jan. 18, 2022, the entire contents of which are hereby incorporated by reference.

BACKGROUND

1. Technical Field

One or more embodiments described herein relate to a display device and a method of manufacturing the display device.

2. Description of the Related Art

Various display devices are used for multimedia devices. Examples include televisions, mobile phones, tablet computers, navigation systems, and game machines. As the fields of use of display devices are diversified, the types of display panels used in the display devices are also being diversified. Examples of the display panels include an organic light-emitting display panel, an inorganic light-emitting display panel, a quantum dot light-emitting display panel, or the like.

SUMMARY

One or more embodiments described herein may reduce the power consumption of a display device and increase the maximum luminance of the display device by increasing the ratio of light (extracted to the outside) among the light generated in a display element layer.

An embodiment of the inventive concept provides a display device including a display element layer including a first electrode layer, a light-emitting layer disposed on the first electrode layer, and a second electrode layer disposed on the light-emitting layer. The display device includes a capping layer disposed on the second electrode layer and a protective layer disposed on the capping layer and covering a portion of the second electrode layer exposed by the capping layer. The display device includes an optical compensation layer disposed on the protective layer and an encapsulation layer disposed on the optical compensation layer. The refractive index of the optical compensation layer is lower than that of the protective layer.

In an embodiment, the refractive index of the optical compensation layer is lower than the refractive index of the capping layer and the refractive index of the encapsulation layer. The refractive index of the protective layer is lower than the refractive index of the capping layer.

In an embodiment, the thickness of the protective layer is less than the thickness of the optical compensation layer.

In an embodiment, the encapsulation layer includes a first inorganic layer disposed on the optical compensation layer, an organic layer disposed on the first inorganic layer, and a second inorganic layer disposed on the organic layer.

In an embodiment, an end of the first inorganic layer and an end of the optical compensation layer are covered by the second inorganic layer.

In an embodiment, the encapsulation layer includes a first encapsulation region in which the organic layer is disposed and a second encapsulation region in which the organic layer is not disposed.

In an embodiment, the second encapsulation region includes a first sub-region which overlaps the optical compensation layer and a second sub-region which does not overlap the optical compensation layer.

In an embodiment, the optical compensation layer, the first inorganic layer, and the second inorganic layer are sequentially disposed in the first sub-region. Only the second inorganic layer among the optical compensation layer, the first inorganic layer, and the second inorganic layer is disposed in the second sub-region.

In an embodiment, the optical compensation layer, the first inorganic layer, and the second inorganic layer are sequentially disposed in the first sub-region. The first inorganic layer and the second inorganic layer are sequentially disposed in the second sub-region.

In an embodiment, the display device further includes a dam layer defining the first encapsulation region.

In an embodiment, the dam layer overlaps the first sub-region and the second sub-region.

In an embodiment, the dam layer overlaps the first sub-region and does not overlap the second sub-region.

In an embodiment of the inventive concept, a method of manufacturing a display device includes disposing a display element layer including a first electrode layer, a light-emitting layer disposed on the first electrode layer, and a second electrode layer disposed on the light-emitting layer. The method of manufacturing the display device includes disposing a capping layer on the second electrode layer and disposing a protective layer on the capping layer, the protective layer covering a portion of the second electrode layer exposed by the capping layer. The method of manufacturing the display device includes disposing an optical compensation layer on the protective layer and disposing an encapsulation layer on the optical compensation layer. The refractive index of the optical compensation layer is lower than that of the protective layer.

In an embodiment, the refractive index of the optical compensation layer is lower than the refractive index of the capping layer and the refractive index of the encapsulation layer. The refractive index of the protective layer is lower than the refractive index of the capping layer.

In an embodiment, the disposing of the protective layer includes depositing the protective layer on the capping layer by a plasma enhanced chemical vapor deposition method using a first voltage having a first magnitude. The disposing of the optical compensation layer includes depositing the optical compensation layer on the protective layer by the plasma enhanced chemical vapor deposition method using a second voltage having a second magnitude. The first magnitude is less than the second magnitude.

In an embodiment, in the depositing of the protective layer on the capping layer, the first voltage is applied for a first time period. In the depositing of the optical compensation layer on the protective layer, the second voltage is applied for a second time period different from the first time period.

In an embodiment, the first time period is shorter than the second time period.

In an embodiment, the encapsulation layer includes a first inorganic layer disposed on the optical compensation layer, an organic layer disposed on the first inorganic layer, and a second inorganic layer disposed on the organic layer. The disposing of the encapsulation layer includes disposing the first inorganic layer on the optical compensation layer, disposing the organic layer on the first inorganic layer, and disposing the second inorganic layer on the organic layer. The disposing of the optical compensation layer, the first inorganic layer, and the second inorganic layer uses a plasma enhanced chemical vapor deposition method, respectively.

In an embodiment, the ratio of oxygen plasma to the gases in a plasma state, which are formed in the disposing of the first and second inorganic layers, is smaller than the ratio of the oxygen plasma to the gases in a plasma state, which are formed in the disposing of the optical compensation layer.

In an embodiment, the ratio of nitrous oxide to the raw material gases which are used in the disposing of the first and second inorganic layers is less than the ratio of the nitrous oxide to the raw material gases which are used in the disposing of the optical compensation layer.

In an embodiment, the disposing of the protective layer and the disposing of the optical compensation layer are sequentially performed in one chamber.

In an embodiment of the inventive concept, a display device includes a display element layer and a capping layer disposed on the display element layer. The display device includes a protective layer disposed on the capping layer and covering a portion of the display element layer exposed by the capping layer. The display device includes an optical compensation layer disposed on the protective layer and an encapsulation layer disposed on the optical compensation layer. The refractive index of the optical compensation layer is lower than that of the protective layer.

In an embodiment of the inventive concept, a display device comprises a first layer disposed on a display element layer; a second layer disposed on the first layer and covering at least a portion of the display element layer; and an optical compensation layer disposed between the first layer and the second layer, wherein a refractive index of the optical compensation layer is different from a refractive index of the first layer and a refractive index of the second layer. The first layer may include a capping layer and the second layer may include an encapsulation layer. A refractive index of the optical compensation layer may be lower than a refractive index of the capping layer and a refractive index of the encapsulation layer.

In addition, a protective layer may be included between the capping layer and the encapsulation layer, wherein a refractive index of the protective layer is greater than the refractive index of the optical compensation layer. The refractive index of the protective layer is lower than the refractive index of the capping layer.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain the principles of the inventive concept. In the drawings.

DETAILED DESCRIPTION

Figure 1:
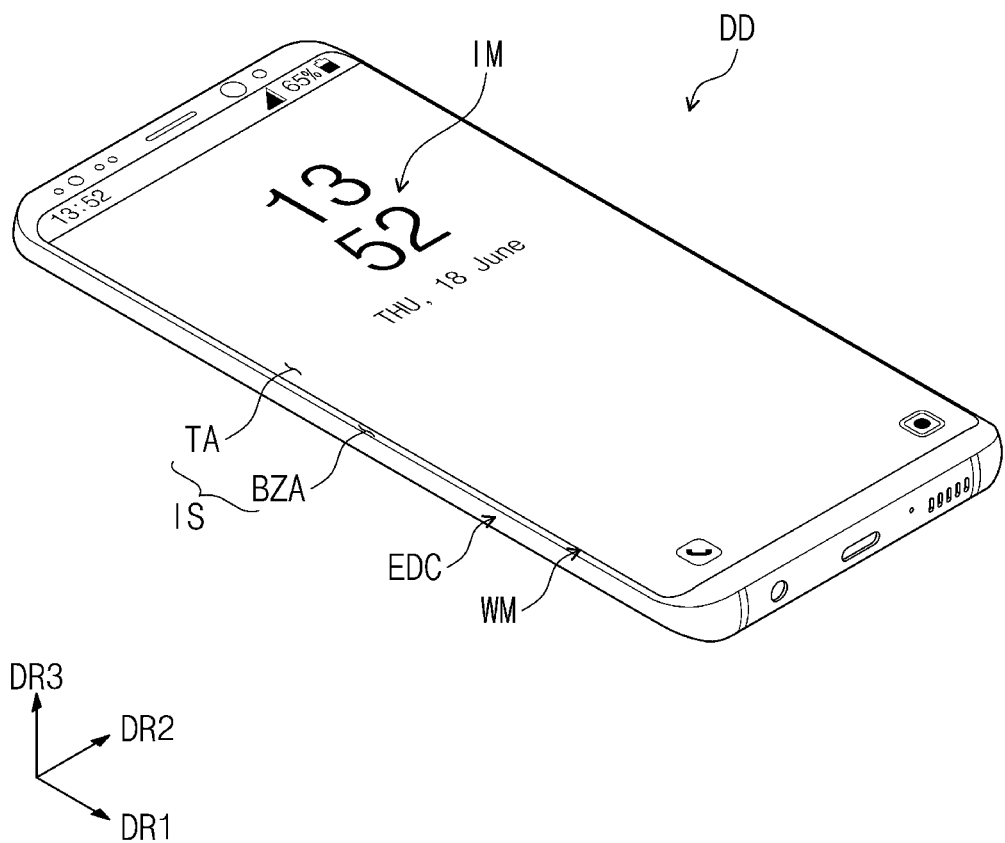
FIG. 1 is a perspective view of a display device according to an embodiment of the inventive concept.

In this specification, it will be understood that when an element (or region, layer, portion, etc.) is referred to as being "on", "connected to" or "coupled to" another element, it can be directly on, connected or coupled to the other element, or intervening elements may be present.

Like reference numerals refer to like elements throughout. In addition, in the drawings, the thicknesses, ratios, and dimensions of elements are exaggerated for effective description of the technical contents. As used herein, the term "and/or" includes any and combinations that the associated configurations can define.

It will be understood that, although the terms first, second, etc. may be used herein to describe various elements, these elements should not be limited by these terms. These terms are only used to distinguish one element from another element. For example, a first element could be termed a second element without departing from the scope of the present invention. Similarly, the second element may also be referred to as the first element. The terms of a singular form include plural forms unless otherwise specified.

In addition, terms, such as "under", "lower", "above", "upper" and the like, are used herein for ease of description to describe one element's relation to another element(s) as illustrated in the figures. The above terms are relative concepts and are described based on the directions indicated in the drawings.

It will be understood that the terms "include" and/or "have", when used in this specification, specify the presence of stated features, integers, operations, elements, components and/or combinations thereof, but do not preclude the presence or addition of one or more other features, integers, operations, elements, components, and/or combinations thereof.

Unless otherwise defined, terms (including technical and scientific terms) used herein have the meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described with reference to the accompanying drawings.

Figure 2:
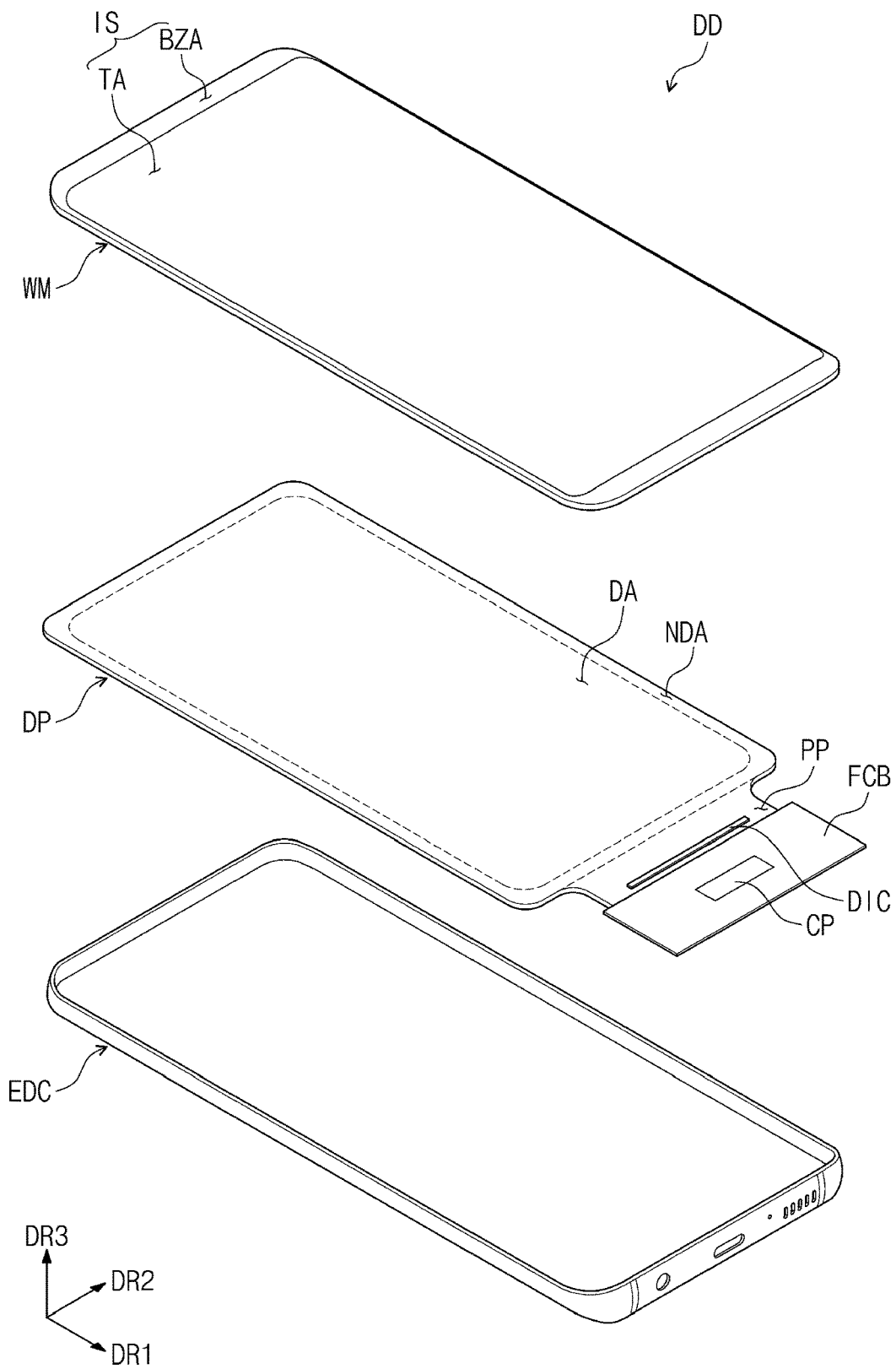
FIG. 2 is an exploded perspective view of the display device according to an embodiment of the inventive concept.

FIG. 1 is a perspective view of a display device DD according to an embodiment of the inventive concept, and FIG. 2 is an exploded perspective view of the display device according to an embodiment of the inventive concept.

Referring to FIG. 1, the display device DD may be activated according to an electrical signal. FIGS. 1 and 2 illustrate an example of the display device DD in the form of a smartphone. However, the inventive concept is not limited thereto. The display device DD may be a large display device (such as a television or a monitor) or a small or medium display device (such as a tablet, a notebook computer, a car navigation system, or a game machine). These are presented only as examples, and the display device DD may be implemented as another type of display device.

In one embodiment, the display device DD has a long side in a first direction DR1, a short side in a second direction DR2 crossing the first direction DR1, and a tetragonal shape with rounded vertices. However, the shape of the display device DD may be different in other embodiments (e.g. a circular shape or another shape). The display device DD may display an image IM in a third direction DR3 on a display surface IS parallel to each of the first and second directions DR1 and DR2. The display surface IS on which the image IM is displayed may correspond to the front surface of the display device DD.

In this embodiment, the front surface (or upper surface) and the rear surface (or lower surface) of each member are defined based on the direction in which the image IM is displayed. The front surface and the rear surface may be opposed to each other in the third direction DR3, and a normal direction of each of the front surface and the rear surface may be parallel to the third direction DR3.

A separation distance between the front surface and the rear surface in the third direction DR3 may correspond to the thickness of the display device DD in the third direction DR3. Meanwhile, directions indicated by the first to third directions DR1, DR2, and DR3 are relative concepts. Different directions may be used to describe the various features of the display device in other embodiments.

The display surface IS of the display device DD may be divided into a transmission region TA and a bezel region BZA. The transmission region TA may be a region in which an image IM is displayed. A user visually recognizes an image IM through the transmission region TA. In this embodiment, the transmission region TA is illustrated as having a tetragonal shape with rounded vertices. However, this is illustrated as an example, and the transmission region TA may have various other shapes and is not limited to any one embodiment.

The bezel region BZA is adjacent to the transmission region TA and may have a predetermined color. The bezel region BZA may surround the transmission region TA. Accordingly, the shape of the transmission region TA may be determined substantially defined by the bezel region BZA. However, this is illustrated as an example, and the bezel region BZA may be disposed to be adjacent to only one side of the transmission region TA or may be omitted in other embodiments. The display device DD according to an embodiment of the inventive concept may include various embodiments and is not limited to any one embodiment.

As illustrated in FIG. 2, the display device DD may include a window WM, a display panel DP, and an outer case EDC. The window WM protects the upper surface of the display panel DP. The window WM may be optically transparent. The window WM may be formed of a transparent material capable of emitting an image IM. For example, the window WM may be composed of glass, sapphire, plastic, and/or the like. The window WM is illustrated as a single layer, but is not limited thereto and may include a plurality of layers.

Meanwhile, the above-described bezel region BZA of the display device DD may be provided as a region in which a material including a predetermined color is printed on one region of the window WM. As an example of the inventive concept, the window WM may include a light blocking pattern for defining the bezel region BZA. The light blocking pattern may be formed as a colored organic layer, for example, by a coating method.

The window WM may be coupled to the display panel DP by an adhesive film. As an example of the inventive concept, the adhesive film may include an optically clear adhesive film (OCA). However, the adhesive film is not limited thereto and may include a other types of adhesives or a glue agent. For example, the adhesive film may include an optically clear resin (OCR) or a pressure sensitive adhesive film (PSA).

An anti-reflection layer may be further disposed between the window WM and the display panel DP. The anti-reflection layer reduces the reflectance of external light incident from the upper side of the window WM. The anti-reflection layer according to an embodiment of the inventive concept may include a retarder and a polarizer. The retarder may be a film type or a liquid crystal coating type and, for example, may include a $\lambda/2$ retarder and/or a $\lambda/4$ retarder. The polarizer may also be a film type or a liquid crystal coating type. The film type may include, for example, a stretchable synthetic resin film. The liquid crystal coating type may include, for example, liquid crystals arranged in a predetermined arrangement. The retarder and the polarizer may be implemented as one polarizing film.

As an example of the inventive concept, the anti-reflection layer may include color filters. The arrangement of the color filters may be determined in consideration of colors of light generated by a plurality of pixels included in the display panel DP. The anti-reflection layer may further include a light blocking pattern.

The display panel DP may include a display region DA which displays an image IM and a non-display region NDA adjacent to the display region DA. The display region DA may be a region for displaying the image IM provided from the display panel DP. The non-display region NDA may surround the display region DA. However, this is illustrated as an example, and the non-display region NDA may have various shapes and is not limited to any one embodiment. For example, the non-display region NDA may be adjacent to one or both sides of the display region DA. According to an embodiment of the inventive concept, the display region DA of the display panel DP may correspond to at least a portion of the transmission region TA, and the non-display region NDA may correspond to the bezel region BZA.

The display panel DP according to an embodiment of the inventive concept may be a light-emitting display panel. For example, the display panel DP may be an organic light-emitting display panel, an inorganic light-emitting display panel, or a quantum dot light-emitting display panel. A light-emitting layer of the organic light-emitting display panel may contain an organic light-emitting material. A light-emitting layer of the inorganic light-emitting display panel may contain an inorganic light-emitting material. A light-emitting layer of the quantum dot light-emitting display panel may contain quantum dots, quantum rods, or the like. Hereinafter, the display panel DP in this embodiment will be described as an organic light-emitting display panel.

As an example of the inventive concept, the display device DD may further include an input sensing layer configured to sense an external input (e.g. a touch event, etc.). The input sensing layer may be disposed directly on the display panel DP. According to an embodiment of the inventive concept, the input sensing layer may be formed on the display panel DP through a continuous process. For example, when the input sensing layer is disposed directly on the display panel DP, an adhesive film may not be disposed between the input sensing layer and the display panel DP. However, the embodiment of the inventive concept is not limited thereto. The adhesive film may be disposed between the input sensing layer and the display panel DP. In this case, the input sensing layer is not manufactured together with the display panel DP through a continuous process, but is manufactured through a process separate from that of the display panel DP and then may be fixed to the upper surface of the display panel DP by an adhesive film.

As an example of the inventive concept, the display device DD may further include a driving chip DIC, a controller CP, and a flexible circuit film FCB. As an example of the inventive concept, the display panel DP may further include a pad region PP extending from the non-display region NDA.

A driving chip DIC and pads may be disposed in the pad region PP. However, the inventive concept is not limited thereto. In one embodiment, the driving chip DIC may be mounted on the flexible circuit film FCB, and the display panel DP may be electrically connected to the flexible circuit film FCB through the pads. As an example of the inventive concept, the controller CP may be mounted on the flexible circuit film FCB. The flexible circuit film FCB may include a plurality of driving elements, which, for example, may include a circuit unit configured to drive the display panel DP. As an example of the inventive concept, the pad region PP may be bent or curved and then disposed on the rear surface of the display panel DP.

The outer case EDC may be coupled to the window WM to define the appearance of the display device DD. The outer case EDC protects the components accommodated in the outer case EDC by absorbing external shock and preventing foreign substances/moisture from entering into the display panel DP. Meanwhile, as an example of the inventive concept, the outer case EDC may be provided in a form in which a plurality of accommodation members are coupled to each other.

The display device DD according to an embodiment of the inventive concept may further include one or more electronic modules including various functional modules configured to operate the display panel DP, a power supply module configured to supply the power for overall operation of the display device DD, a bracket coupled to the outer case EDC and configured to divide the internal space of the display device DD.

Figure 3:
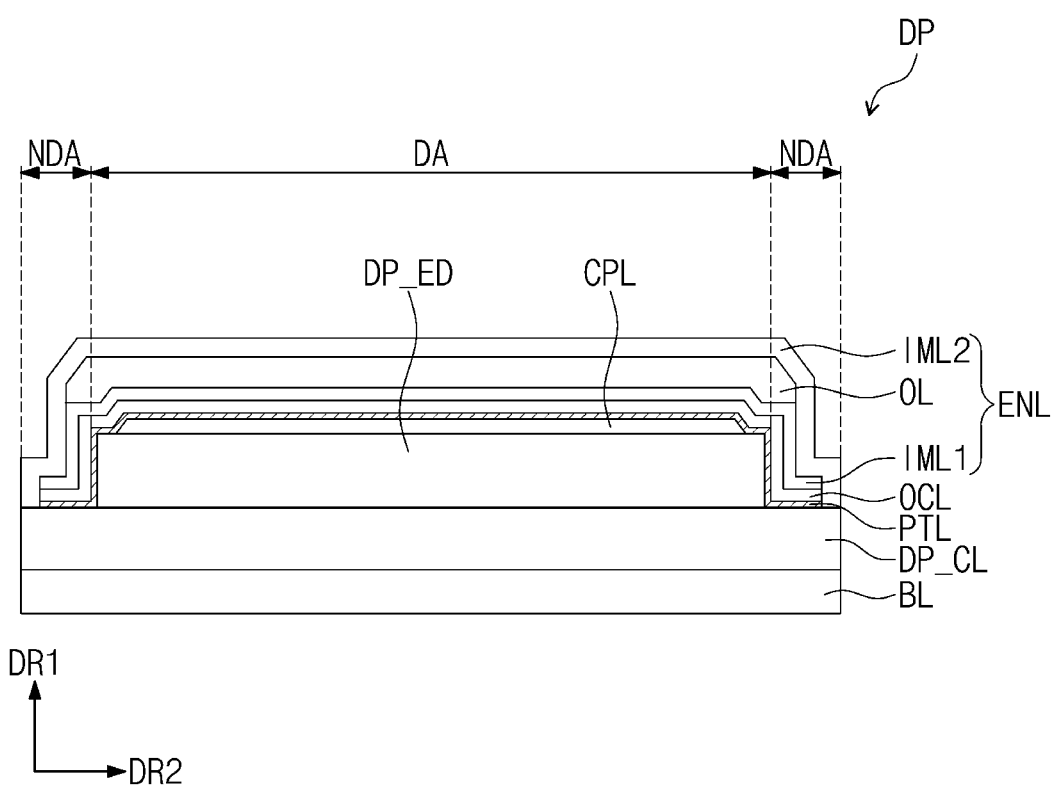
FIG. 3 is a cross-sectional view of a display panel according to an embodiment of the inventive concept.

FIG. 3 is a cross-sectional view of a display panel DP according to an embodiment of the inventive concept. Referring to FIG. 3, the display panel DP includes a base layer BL, a circuit element layer DP_CL, a display element layer DP_ED, a capping layer CPL, a protective layer PTL, an optical compensation layer OCL, and an encapsulation layer ENL. The display panel DP according to the inventive concept may be a flexible display panel. However, the inventive concept is not limited thereto. For example, the display panel DP may be a foldable display panel (e.g., one folded based on a folding axis) or a rigid display panel.

The base layer BL may include at least one synthetic resin layer. The synthetic resin layer may be a polyimide-based resin layer, and the material thereof is not particularly limited. In addition to the synthetic resin layer, the base layer BL may include a glass material layer, a metal material layer, or an organic/inorganic composite material layer. The display region DA and the non-display region NDA described with reference to FIG. 2 may be equally defined in the base layer BL.

The circuit element layer DP_CL is disposed on the base layer BL. The circuit element layer DP_CL includes at least one insulating layer and a circuit element. Hereinafter, the insulating layer included in the circuit element layer DP_CL may be referred to as an intermediate insulating layer. The intermediate insulating layer includes at least one intermediate inorganic layer and at least one intermediate organic layer. The circuit element includes a pixel driving circuit, a signal line, and the like which are included in each of a plurality of pixels configured to display an image IM.

The display element layer DP_ED is disposed on the circuit element layer DP_CL. The display element layer DP_ED includes a light-emitting element ED (e.g., refer to FIG. 4) included in each of the pixels. As an example of the inventive concept, the light-emitting element ED may include organic light-emitting diodes. The display element layer DP_ED may further include an organic layer such as a pixel defining film PDL (e.g., refer to FIG. 4). As an example of the inventive concept, the region in which the display element layer DP_ED is disposed may correspond to the display region DA. The region in which the display element layer DP_ED is not disposed may correspond to the non-display region NDA.

The capping layer CPL is disposed on the display element layer DP_ED. The capping layer CPL may include multiple layers or a single layer. As an example of the inventive concept, the capping layer CPL may be an organic layer or an inorganic layer. When the capping layer CPL contains an inorganic material, the inorganic material may include an alkali metal compound such as LiF, an alkaline earth metal compound such as $MgF_2$, SiON, $SiN_{-x}$, $SiO_{-y}$, and the like. When the capping layer CPL contains an organic material, the organic material may include α-NPD, NPB, TPD, m-MTDATA, $Alq_3$, CuPc, TPD15 (N4, N4'-tetra (biphenyl-4-yl) biphenyl-4, 4'-diamine), TCTA (4, 4', 4"-Tris (carbazol sol-9-yl) triphenylamine), or the like, or may include an epoxy resin or an acrylate such as a methacrylate.

The protective layer PTL is disposed on the capping layer CPL. As an example of the inventive concept, the protective layer PTL may be disposed on the capping layer CPL and a portion of the display element layer DP_ED. The portion (hereinafter, exposed portion) of the display element layer DP_ED may be an exposed portion that is not covered by the capping layer CPL. As the protective layer PTL covers the capping layer CPL and the exposed portion of the display element layer DP_ED, the protective layer PTL may protect the capping layer CPL and the exposed portion of the display element layer DP_ED in the process of forming the optical compensation layer OCL which will be described later.

As an example of the inventive concept, the protective layer PTL may contain an oxide such as $SiO_x$, a fluoride such as LiF, $MgF_2$, $AlF_3$, NaF, $CaF_2$, $Na_3AlF_6$, and the like. The refractive index of the protective layer PTL may be smaller than that of the capping layer CPL. As an example of the inventive concept, the protective layer PTL may be disposed in a portion of the display region DA and the non-display region NDA. In one embodiment, when the exposed portion of the display element layer DP_ED is positioned in the non-display region NDA, the protective layer PTL may be disposed to cover the exposed portion of the display element layer DP_ED and a portion of the capping layer in the non-display region NDA.

The optical compensation layer OCL is disposed on the protective layer PTL. As an example of the inventive concept, the optical compensation layer OCL may contain an oxide such as $SiO_x$, a fluoride such as LiF, $MgF_2$, $AlF_3$, NaF, $CaF_2$, $Na_3AlF_6$, or the like. As an example of the inventive concept, the refractive index of the optical compensation layer OCL is lower than the refractive index of the capping layer CPL and the refractive index of the encapsulation layer ENL. As an example of the inventive concept, the refractive index of the optical compensation layer OCL may be about 1.5 or less.

Due to a difference between the refractive index of the optical compensation layer OCL and the refractive index of the capping layer CPL, light generated from the light-emitting element ED may be reflected at the interface between the optical compensation layer OCL and the capping layer CPL. Due to a difference between the refractive index of the optical compensation layer OCL and the refractive index of the encapsulation layer ENL, light generated from the light-emitting element ED may be reflected at the interface between the optical compensation layer OCL and the encapsulation layer ENL.

A resonance phenomenon may occur due to constructive interference between light generated from the light-emitting element ED and light reflected at the interface between the optical compensation layer OCL and the capping layer CPL. In addition, a resonance phenomenon may occur due to constructive interference between light generated by the light-emitting element ED and light reflected at the interface between the optical compensation layer OCL and the encapsulation layer ENL. Accordingly, as the intensity of light provided to the outside of the display device DD increases, the external light extraction efficiency of the display device DD may be improved.

The encapsulation layer ENL seals the display element layer DP_ED, the protective layer PTL, and/or the optical compensation layer OCL. The encapsulation layer ENL includes at least one inorganic layer. In one embodiment, the encapsulation layer ENL may further include at least one organic layer. As an example of the inventive concept, the encapsulation layer ENL may include a first inorganic layer IML1, an organic layer OL, and a second inorganic layer IML2. The first and second inorganic layers IML1 and IML2 protect the display element layer DP_ED from moisture/oxygen. The organic layer OL protects the display element layer DP_ED from foreign substances such as dust particles. The first and second inorganic layers IML1 and IML2 may include a silicon nitride layer, a silicon oxynitride layer, a silicon oxide layer, a titanium oxide layer, an aluminum oxide layer, or the like. The organic layer OL may include, but is not limited to, an acrylic-based organic material.

Figure 4:
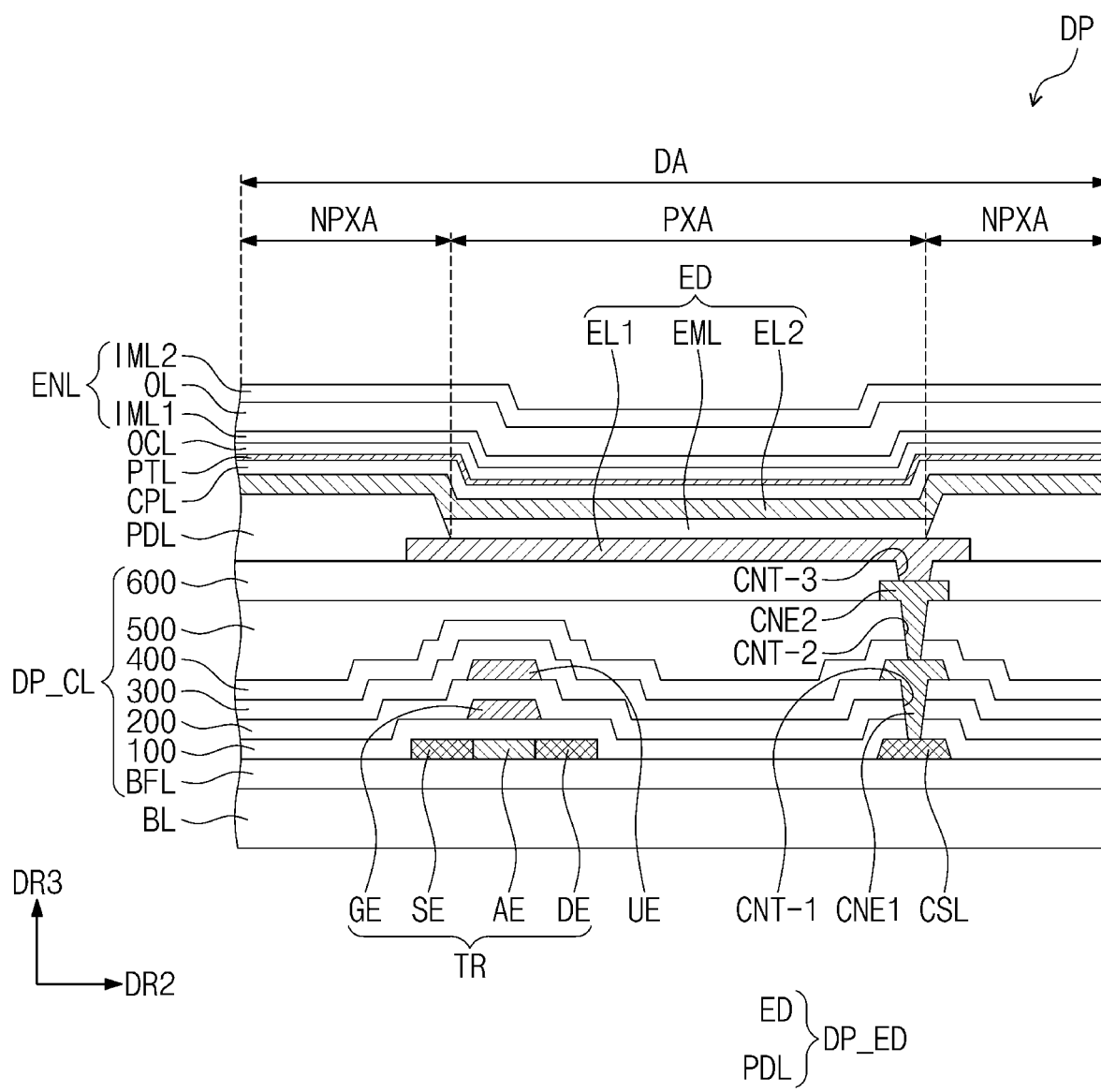
FIG. 4 is a cross-sectional view of a display panel in a display region according to an embodiment of the inventive concept.

FIG. 4 is a cross-sectional view of a display panel DP in the display region according to an embodiment of the inventive concept. Referring to FIG. 4, the display panel DP includes a base layer BL, a circuit element layer DP_CL, a display element layer DP_ED, a capping layer CPL, a protective layer PTL, an optical compensation layer OCL, and an encapsulation layer ENL.

As an example of the inventive concept, the base layer BL may include a synthetic resin layer. The synthetic resin layer may include a thermosetting resin. The base layer BL may have a multi-layered structure. For example, the base layer BL may have a three-layer structure of a synthetic resin layer, an adhesive layer, and a synthetic resin layer. In one embodiment, the synthetic resin layer may contain at least one of a polyimide-based resin, an acrylate-based resin, a methacrylate-based resin, polyisoprene, a vinyl-based resin, an epoxy-based resin, a urethane-based resin, a cellulose—based resin, a siloxane-based resin, a polyamide-based resin, or a perylene-based resin.

At least one inorganic layer may be disposed on the upper surface of the base layer BL. The inorganic layer may contain at least one of aluminum oxide, titanium oxide, silicon oxide, silicon oxynitride, zirconium oxide, or hafnium oxide. The inorganic layer may be formed in multiple layers. The multi-layered inorganic layers may constitute a barrier layer and/or a buffer layer. In this embodiment, the circuit element layer DP_CL is illustrated as including the buffer layer BFL.

The circuit element layer DP_CL includes a plurality of intermediate insulating layers and a plurality of circuit elements. The circuit elements may include a semiconductor pattern, a conductive pattern, a signal line, or the like. The intermediate insulating layer, the semiconductor layer and the conductive layer may be formed by coating, deposition, or the like. Hereafter, the intermediate insulating layer, the semiconductor layer and the conductive layer may be selectively patterned through a photolithography process. In this way, the semiconductor pattern, the conductive pattern, the signal line or the like, which are included in the circuit element layer DP_CL, may be formed.

The circuit element layer DP_CL includes a buffer layer BFL, a first intermediate insulating layer 100, a second intermediate insulating layer 200, a third intermediate insulating layer 300, a fourth intermediate insulating layer 400, a fifth intermediate insulating layer 500, and a sixth intermediate insulating layer 600.

The buffer layer BFL may improve a bonding force between the base layer BL and the semiconductor pattern. The buffer layer BFL may include a silicon oxide layer and a silicon nitride layer which, for example, may be alternately stacked.

The semiconductor pattern may be disposed on the buffer layer BFL. The semiconductor pattern may contain polysilicon. However, the embodiment of the inventive concept is not limited thereto, and the semiconductor pattern may contain amorphous silicon or metal oxide in other embodiments.

FIG. 4 illustrates only a portion of the semiconductor pattern and, on a plane, the semiconductor pattern may be further disposed in another region of a pixel. The semiconductor pattern may be arranged in a specific rule across the pixels. The semiconductor pattern may have different electrical properties depending on whether it is doped or not. The semiconductor pattern may include a first semiconductor region having high conductivity and a second semiconductor region having low conductivity. The first semiconductor region may be doped with an N-type dopant or a P-type dopant. A P-type transistor includes a doped region doped with a P-type dopant. The second semiconductor region may be a non-doped region or may be doped at a lower concentration than the first semiconductor region.

The conductivity of the first semiconductor region is greater than that of the second semiconductor region, and the first semiconductor region substantially serves as an electrode or a signal line. The second semiconductor region substantially corresponds to a channel (or active) region of a transistor. For example, a portion of the semiconductor pattern may be a channel region of the transistor, another portion thereof may be a source region or a drain region of the transistor, and still another portion thereof may be a connection electrode or a connection signal line.

As illustrated in FIG. 4, the source region SE, the channel region AE, and the drain region DE of the transistor TR are formed from the semiconductor pattern. The source region SE and the drain region DE may extend in opposite directions from each other from the channel region AE on a cross section. FIG. 4 illustrates a portion of a connection signal line CSL formed from the semiconductor pattern. Although not illustrated separately, the connection signal line CSL may be electrically connected to the drain region DE of the transistor TR on a plane.

The first intermediate insulating layer 100 is disposed on the buffer layer BFL. The first intermediate insulating layer 100 overlaps a plurality of pixels in common and covers the semiconductor pattern. The first intermediate insulating layer 100 may be an inorganic layer and/or an organic layer and have a single-layered or multi-layered structure. The first intermediate insulating layer 100 may contain at least one of aluminum oxide, titanium oxide, silicon oxide, silicon oxynitride, zirconium oxide, or hafnium oxide. In this embodiment, the first intermediate insulating layer 100 may be a single-layered silicon oxide layer. Not only the first intermediate insulating layer 100, but also the intermediate insulating layers 200, 300, 400, 500 and 600 of the circuit element layer DP_CL (to be described later) may be inorganic and/or organic layers and have single-layered or multi-layered structures. An inorganic layer may contain at least one of the above-mentioned materials.

A gate GE of the transistor TR is disposed on the first intermediate insulating layer 100. The gate GE may be a portion of the metal pattern. The gate GE may overlap the channel region AE. In the process of doping the semiconductor pattern, the gate GE may function as a mask.

The second intermediate insulating layer 200 covering the gate GE is disposed on the first intermediate insulating layer 100. The second intermediate insulating layer 200 may overlap the pixels in common. The second intermediate insulating layer 200 may be an inorganic layer and/or an organic layer and have a single-layered or multi-layered structure. In this embodiment, the second intermediate insulating layer 200 may be a single-layered silicon oxide layer.

An upper electrode UE is disposed on the second intermediate insulating layer 200. The upper electrode UE may overlap the gate GE. The upper electrode UE may be a portion of the metal pattern. A portion of the gate GE and the upper electrode UE overlapping the gate GE may define a capacitor. In an embodiment of the inventive concept, the upper electrode UE may be omitted.

The third intermediate insulating layer 300 covering the upper electrode UE is disposed on the second intermediate insulating layer 200. The third intermediate insulating layer 300 may overlap the pixels in common. The third intermediate insulating layer 300 may be an inorganic layer and/or an organic layer and have a single-layered or multi-layered structure. In this embodiment, the third intermediate insulating layer 300 may be a single-layered silicon oxide layer.

A first connection electrode CNE1 may be disposed on the third intermediate insulating layer 300. The first connection electrode CNE1 may be connected to the connection signal line CSL through a first contact hole CNT-1 passing through the first to third intermediate insulating layers 100, 200, and 300.

The fourth intermediate insulating layer 400 may be disposed on the third intermediate insulating layer 300. The fourth intermediate insulating layer 400 may be a single-layered silicon oxide layer.

The fifth intermediate insulating layer 500 is disposed on the fourth intermediate insulating layer 400. The fifth intermediate insulating layer 500 may be an organic layer. A second connection electrode CNE2 may be disposed on the fifth intermediate insulating layer 500. The second connection electrode CNE2 may be connected to the first connection electrode CNE1 through a second contact hole CNT-2 passing through the fourth and fifth intermediate insulating layers 400 and 500.

The sixth intermediate insulating layer 600 covering the second connection electrode CNE2 is disposed on the fifth intermediate insulating layer 500. The sixth intermediate insulating layer 600 may be an organic layer.

The display element layer DP_ED may be formed on the circuit element layer DP_CL. As an example of the inventive concept, the display element layer DP_ED may include a light-emitting element ED and a pixel defining film PDL. The light-emitting element ED may include a first electrode layer EL1 disposed on the circuit element layer DP_CL, a light-emitting layer EML disposed on the first electrode layer EL1, and a second electrode layer EL2 disposed on the light-emitting layer EML. The first electrode layer EL1 is disposed on the sixth intermediate insulating layer 600. The first electrode layer EL1 is connected to the second connection electrode CNE2 through a third contact hole CNT-3 passing through the sixth intermediate insulating layer 600.

The pixel defining film PDL may be disposed on the sixth intermediate insulating layer 600 and cover a portion of the first electrode layer ELL The pixel defining film PDL has a pixel opening defined therein. The pixel opening exposes at least a portion of the first electrode layer EL1. As an example of the inventive concept, a light-emitting region PXA may correspond to a partial region of the first electrode layer EL1 exposed by the pixel opening. The non-light-emitting region NPXA may surround the light-emitting region PXA.

The light-emitting layer EML is disposed on the first electrode layer ELL The light-emitting layer EML may be disposed in a region corresponding to the pixel opening. For example, the light-emitting layer EML may be separately disposed in each of the pixels. The light-emitting layer EML may contain a light-emitting material including a fluorescent material or a phosphorescent material. The light-emitting material may include an organic light-emitting material or an inorganic light-emitting material and is not limited to any one embodiment.

The second electrode layer EL2 is disposed on the light-emitting layer EML. The second electrode layer EL2 is provided in the form of one common electrode and is commonly disposed in the plurality of pixels.

As an example of the inventive concept, the light-emitting element ED may further include a hole control layer and an electron control layer. The hole control layer is disposed between the first electrode layer EL1 and the light-emitting layer EML and may further include a hole injection layer. The electron control layer is disposed between the light-emitting layer EML and the second electrode layer EL2 and may further include an electron injection layer.

The capping layer CPL is disposed on the second electrode layer EL2. The capping layer CPL may be commonly disposed on the plurality of pixels. As an example of the inventive concept, the capping layer CPL may be disposed in the light-emitting region PXA and the non-light-emitting region NPXA. As an example of the inventive concept, the refractive index of the capping layer CPL may be 1.6 or more. The refractive index of the second electrode layer EL2 is greater than that of the capping layer CPL. Due to a difference between the refractive index of the second electrode layer EL2 and the refractive index of the capping layer CPL, some of the light generated from the light-emitting layer EML is reflected at the boundary between the second electrode layer EL2 and the capping layer CPL. When the light reflected at the boundary between the second electrode layer EL2 and the capping layer CPL is referred to as a first reflected light, the first reflected light is reflected repeatedly at the boundaries among the first electrode layer EL1, the second electrode layer EL2, and the capping layer CPL. Accordingly, the first reflected light constructively interferes so that a resonance phenomenon occurs. The intensity of light provided to the outside from the capping layer CPL is increased by the resonance phenomenon. Accordingly, the light generated by the light-emitting element ED may improve the extraction efficiency of external light which is provided to the outside of the display device DD (e.g., refer to FIG. 1). In addition, the capping layer CPL may protect the second electrode layer EL2 from being damaged in the process of forming the optical compensation layer OCL and the like.

The protective layer PTL is disposed on the capping layer CPL. The protective layer PTL may be commonly disposed on the plurality of pixels. As an example of the inventive concept, the protective layer PTL may be disposed in the light-emitting region PXA and the non-light-emitting region NPXA. As an example of the inventive concept, the refractive index of the protective layer PTL is lower than the refractive index of the capping layer CPL. As an example of the inventive concept, the thickness of the protective layer PTL is lower than the thickness of the optical compensation layer OCL.

The optical compensation layer OCL is disposed on the protective layer PTL. The optical compensation layer OCL may be commonly disposed in the plurality of pixels. As an example of the inventive concept, the optical compensation layer OCL may be disposed in the light-emitting region PXA and the non-light-emitting region NPXA. The optical compensation layer OCL may come in contact with the protective layer PTL and may not come in contact with the second electrode layer EL2. The region in which the optical compensation layer OCL is disposed may correspond to the region in which the protective layer PTL is disposed. As an example of the inventive concept, the refractive index of the optical compensation layer OCL is lower than that of the protective layer PTL. The refractive index of the optical compensation layer OCL is lower than that of the capping layer CPL. The refractive index of the optical compensation layer OCL is lower than that of the first inorganic layer IML1 to be described later. As an example of the inventive concept, the refractive index of the optical compensation layer OCL may be about 1.5 or less.

Due to a difference between the refractive index of the optical compensation layer OCL and the refractive index of the protective layer PTL, some of the light generated from the light-emitting layer EML is reflected at the boundary between the optical compensation layer OCL and the protective layer PTL. When the light reflected at the boundary between the optical compensation layer OCL and the protective layer PTL is referred to as a second reflected light, the second reflected light is repeatedly reflected at the boundary between the optical compensation layer OCL and the protective layer PTL and at the boundary between the capping layer CPL and the second electrode layer EL2.

In addition, due to a difference between the refractive index of the optical compensation layer OCL and the refractive index of the first inorganic layer IML1, some of the light generated from the light-emitting layer EML is reflected at the boundary between the optical compensation layer OCL and the first inorganic layer IML1. When the light reflected at the boundary between the optical compensation layer OCL and the first inorganic layer IML1 is referred to as a third reflected light, the third reflected light is repeatedly reflected at the boundary between the optical compensation layer OCL and the first inorganic layer IML1 and at the boundary between the capping layer CPL and the second electrode layer EL2. Accordingly, the second reflected light and the third reflected light constructively interfere so that a resonance phenomenon occurs.

Due to the resonance phenomenon, the intensity of light which is provided to the outside from the display device DD is increased. Accordingly, the light generated by the light-emitting element ED may improve the extraction efficiency of external light which is provided to the outside of the display device DD. However, the inventive concept is not limited thereto. For example, the second reflected light may be repeatedly reflected at the boundaries between layers formed between the optical compensation layer OCL and the first electrode layer ELL The third reflected light may be repeatedly reflected at the boundaries between layers formed between the first inorganic layer IML1 and the first electrode layer ELL The encapsulation layer ENL may be disposed on the display element layer DP_ED, the protective layer PTL, and/or the optical compensation layer OCL. The encapsulation layer ENL is commonly disposed in the plurality of pixels and may include a first inorganic layer IML1, an organic layer OL, and a second inorganic layer IML2. The first inorganic layer IML1 may be disposed on the optical compensation layer OCL. The organic layer OL is disposed on the first inorganic layer IML1. The second inorganic layer IML2 may be disposed on the organic layer OL.

Figure 5A:
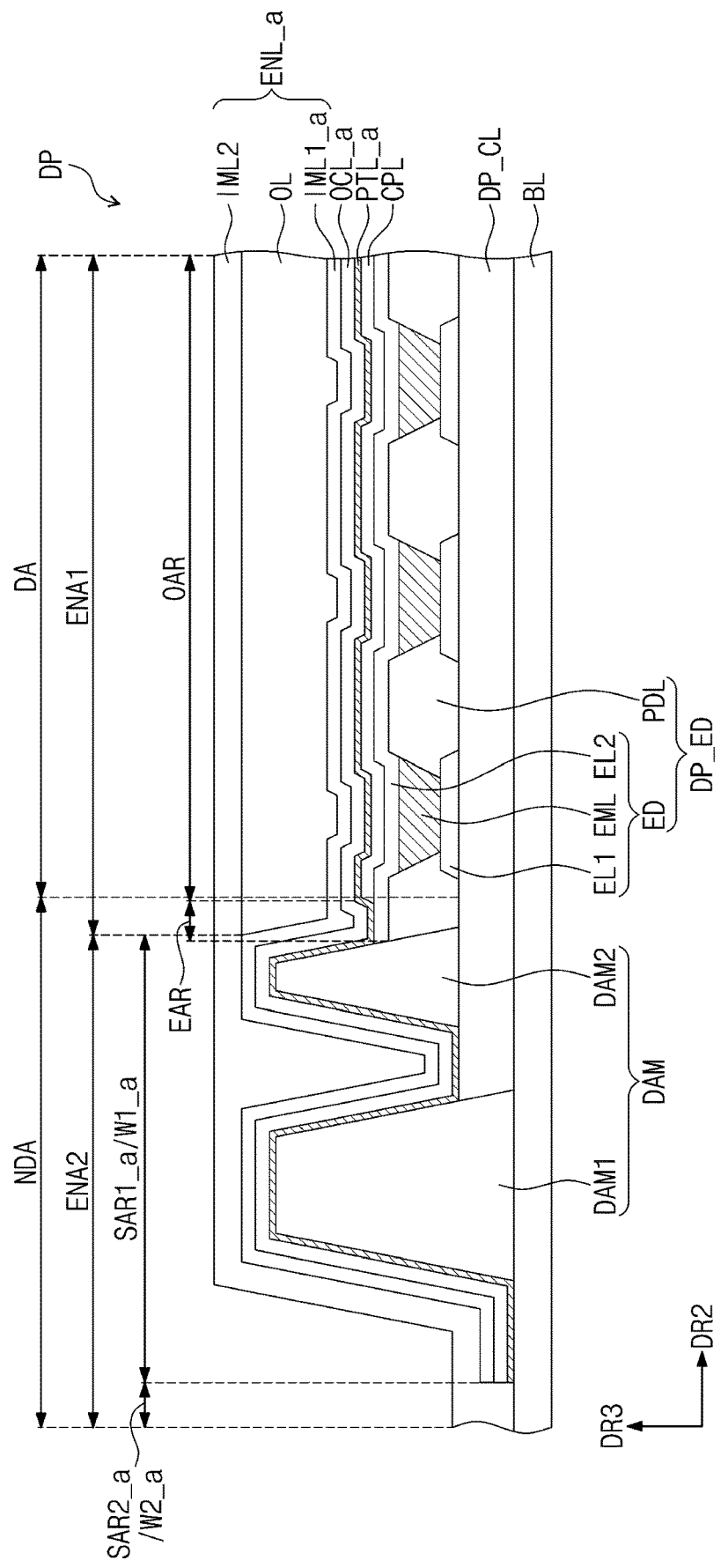
FIGS. 5A to 5C are cross-sectional views of display panels in a display region and a non-display region according to an embodiment of the inventive concept.
Figure 5B:
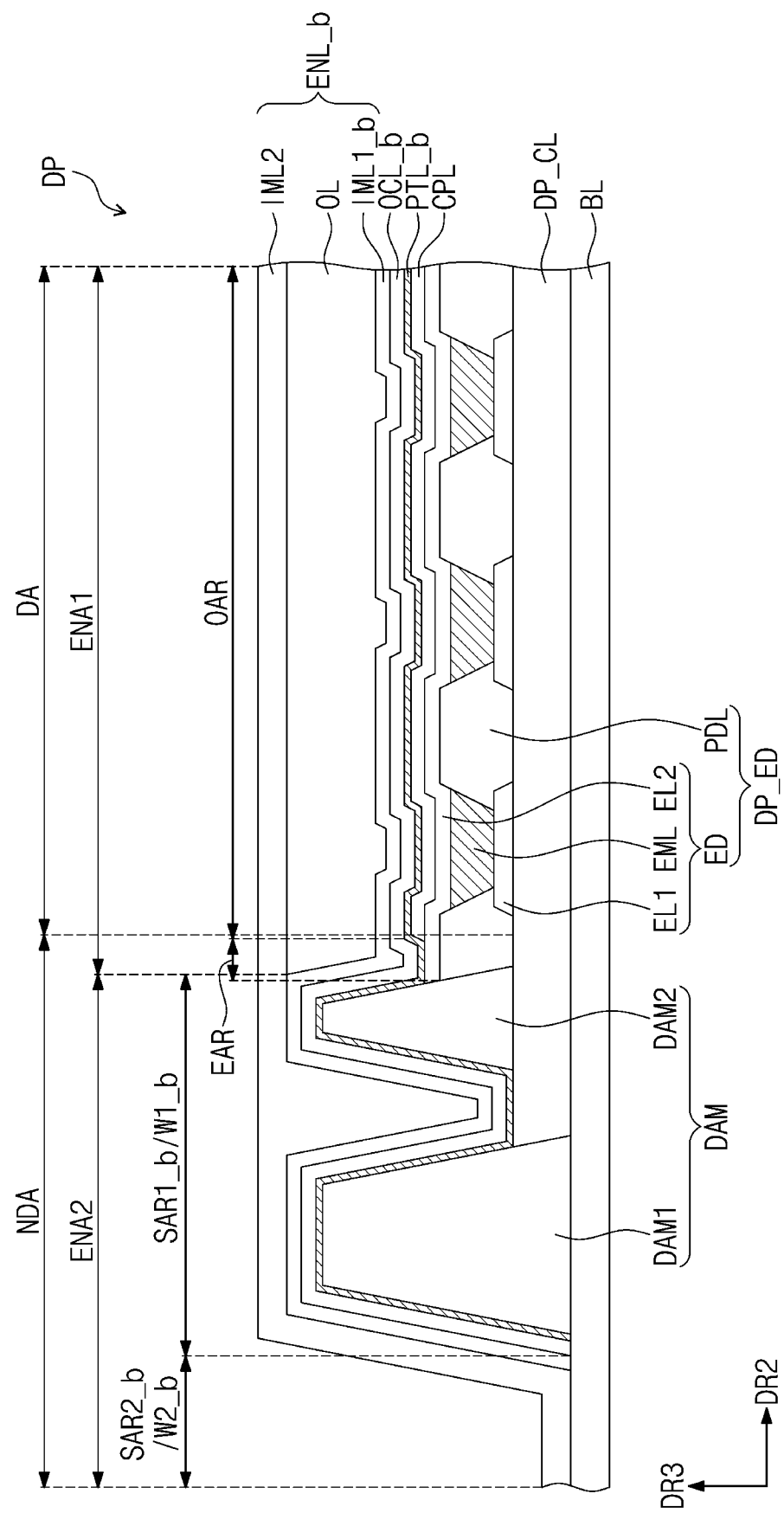
Figure 5C:
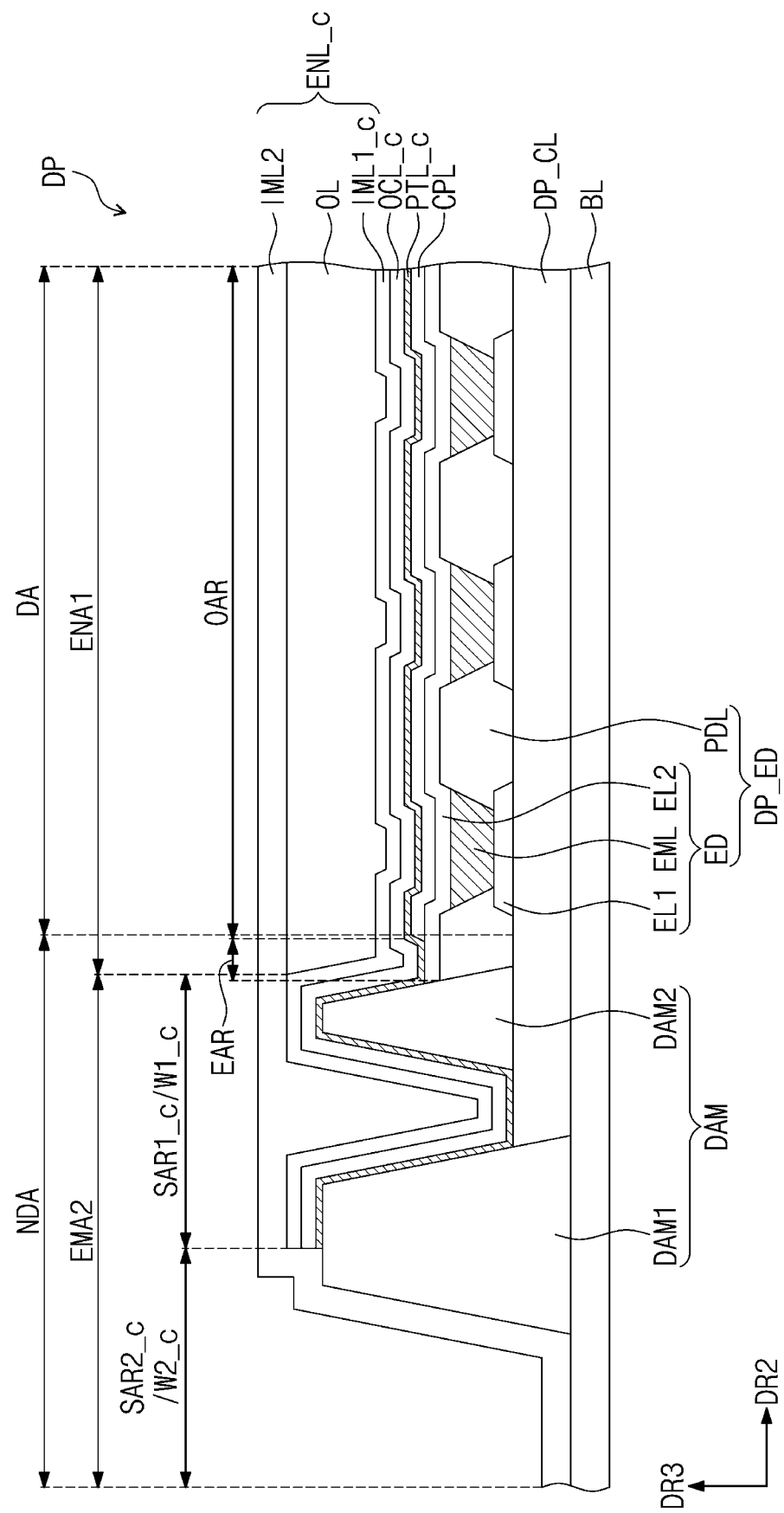

FIGS. 5A to 5C are cross-sectional views of display panels DP in a display region and a non-display region according to an embodiment of the inventive concept. Hereinafter, the components as those described with reference to FIG. 4 will be denoted by like reference numerals, and the redundant descriptions thereof will be omitted.

Referring to FIG. 5A, the display panel DP may further include a dam layer DAM in the non-display region NDA. The dam layer DAM may also be referred to as a protruding part. The dam layer DAM may be formed as a stacked structure including a plurality of insulating layers or may have a single-layered structure. The dam layer DAM may define a region in which the second electrode layer EL2 and the organic layer OL are disposed. The dam layer DAM may prevent the second electrode layer EL2 and the organic layer OL from being deposited beyond the dam layer DAM. For example, the dam layer DAM may include a first dam layer DAM1 disposed on the base layer BL and a second dam layer DAM2 disposed on the circuit element layer DP_CL. The first and second dam layers DAM1 and DAM2 are spaced apart from each other on a plane defined by the first and second directions DR1 and DR2. However, the inventive concept is not limited thereto. In one embodiment, the display panel DP may include one dam layer, or three or more dam layers. The second dam layer DAM2 may prevent the second electrode layer EL2 and the organic layer OL from being deposited beyond the second dam layer DAM2.

As an example of the inventive concept, the display region DA includes a light-emitting region PXA (e.g., refer to FIG. 4) and a non-light-emitting region NPXA (e.g., refer to FIG. 4). The non-display region NDA is a region in which a light-emitting element ED is not disposed and, substantially, an image IM (e.g., refer to FIG. 1) is not displayed.

The second electrode layer EL2 may extend from the display region DA to be disposed in the non-display region NDA.

In the display region DA and the non-display region NDA, the capping layer CPL may be disposed on the second electrode layer EL2 included in the light-emitting element ED in the display element layer DP_ED. For example, in the display region DA and a portion of the non-display region NDA, the capping layer CPL is disposed on the second electrode layer EL2. A region, in which the capping layer CPL is disposed on and overlaps the second electrode layer EL2, is referred to as an overlapping region OAR. A region, in which the capping layer CPL is not disposed on and exposes the second electrode layer EL2, is referred to as an exposed region EAR. As an example of the inventive concept, the exposed region EAR is included in the non-display region NDA.

A protective layer PTL_a is disposed on the capping layer CPL in the overlapping region OAR and on the second electrode layer EL2 in the exposed region EAR. As an example of the inventive concept, the protective layer PTL_a may be disposed on a portion of the second electrode layer EL2, the dam layer DAM, a portion of the circuit element layer DP_CL, and a portion of the base layer BL in the non-display region NDA. The protective layer PTL_a may be disposed on the capping layer CPL and a portion of the second electrode layer EL2 exposed from the capping layer CPL. The protective layer PTL_a covers the capping layer CPL and a portion of the second electrode layer EL2 exposed from the capping layer CPL so that the capping layer CPL and the second electrode layer EL2 can be protected in the process of forming the optical compensation layer OCL.

An optical compensation layer OCL_a is disposed on the protective layer PTL_a. A deposition mask which is used to form the optical compensation layer OCL_a may be the deposition mask used to form the protective layer PTL_a. In this case, the optical compensation layer OCL_a may be disposed in the region in which the protective layer PTL_a is disposed. However, the inventive concept is not limited thereto. In one embodiment, the deposition mask (which is used to form the optical compensation layer OCL_a) and the deposition mask (which is used to form the protective layer PTL_a) may be different from each other. The region in which the protective layer PTL_a is disposed may be located (or included) in the region in which the optical compensation layer OCL_a is disposed. For example, the deposition region of the optical compensation layer OCL_a may be larger or smaller than the deposition region of the protective layer PTL_a. In the display region DA, the optical compensation layer OCL_a and the protective layer PTL_a may be disposed in a common region, but in the non-display region NDA, the optical compensation layer OCL_a is partially disposed on the protective layer PTL_a. Hereinafter, for the convenience of description, it will be described that the region in which the optical compensation layer OCL_a is disposed may correspond to the region in which the protective layer PTL_a is disposed.

A first inorganic layer IML1_a may be disposed on the optical compensation layer OCL_a. An organic layer OL is disposed on the first inorganic layer IML1_a. A second inorganic layer IML2 may be disposed on the organic layer OL. The organic layer OL may be sealed by the dam layer DAM and/or the first and second inorganic layers IML1_a and IML2 disposed on the dam layer DAM. For example, the organic layer OL may be sealed by the second dam layer DAM2 and/or the first and second inorganic layers IML1_a and IML2 disposed on the second dam layer DAM2. Accordingly, the light-emitting element ED may be prevented from being damaged by external moisture and oxygen which may otherwise enter the display panel DP.

As an example of the inventive concept, a deposition mask used when forming the first inorganic layer IML1_a may be the deposition mask used when forming the protective layer PTL_a and the optical compensation layer OCL_a. In this case, the first inorganic layer IML1_a may be disposed in the region in which the protective layer PTL_a and the optical compensation layer OCL_a are disposed. As an example of the inventive concept, the end of the first inorganic layer IML1_a, the end of the passivation layer PTL_a, and the end of the optical compensation layer OCL_a may be arranged side by side in the third direction DR3.

An encapsulation layer ENL_a includes a first encapsulation region ENA1 in which an organic layer OL is disposed and a second encapsulation region ENA2 in which an organic layer OL is not disposed. As an example of the inventive concept, in the first encapsulation region ENA1, the first inorganic layer IML1_a, the organic layer OL and the second inorganic layer IML2 are sequentially disposed. In the second encapsulation region ENA2, the first inorganic layer IML1_a and the second inorganic layer IML2 are sequentially disposed.

As an example of the inventive concept, the second encapsulation region ENA2 includes a first sub-region SAR1_a which overlaps the optical compensation layer OCL_a and a second sub-region SAR2_a which does not overlap the optical compensation layer OCL_a.

The protective layer PTL_a, the optical compensation layer OCL_a, the first inorganic layer IML1_a, and the second inorganic layer IML2 are sequentially disposed in the first sub-region SAR1_a. Only the second inorganic layer IML2 is disposed in the second sub-region SAR2_a. As an example of the inventive concept, the dam layer DAM overlaps the first sub-region SAR1_a and does not overlap the second sub-region SAR2_a.

Since the second inorganic layer IML2 is disposed on the first inorganic layer IML1_a in the first sub-region SAR1_a, external moisture and oxygen may be prevented from entering into the display panel DP through the organic layer OL. As a first length W1_a of the first sub-region SAR1_a increases in the second direction DR2, the effect of preventing external moisture and oxygen from entering into the display panel DP may be improved.

In the second sub-region SAR2_a, the second inorganic layer IML2 covers the first inorganic layer IML1_a, the optical compensation layer OCL_a, and the protective layer PTL_a. For example, in the second sub-region SAR2_a, the second inorganic layer IML2 covers a cross section of the first inorganic layer IML1_a, a cross section of the optical compensation layer OCL_a, and a cross section of the protective layer PTL_a. In the second sub-region SAR2_a, the second inorganic layer IML2 may prevent external moisture and oxygen from entering into the display panel DP through the optical compensation layer OCL_a and the protective layer PTL_a. As a second length W2_a of the second sub-region SAR2_a increases in the second direction DR2, the effect of preventing external moisture and oxygen from entering into the display panel DP may be improved.

Referring to FIG. 5B, the second encapsulation region ENA2 includes a third sub-region SAR1_b which overlaps an optical compensation layer OCL_b and a fourth sub-region SAR2_b which does not overlap the optical compensation layer OCL_b. Hereinafter, like components as those described with reference to FIG. 5A will be denoted by like reference numerals, and the redundant descriptions thereof will be omitted.

As an example of the inventive concept, a protective layer PTL_b is disposed on the capping layer CPL in the overlapping region OAR and on the second electrode layer EL2 in the exposed region EAR. As an example of the inventive concept, in the non-display region NDA, the protective layer PTL_b may be disposed on a portion of the second electrode layer EL2, the dam layer DAM and a portion of the circuit element layer DP_CL.

The optical compensation layer OCL_b is disposed on the protective layer PTL_b. The region in which the optical compensation layer OCL_b is disposed may correspond to the region in which the protective layer PTL_b is disposed.

As an example of the inventive concept, in the third sub-region SAR1_b, the protective layer PTL_b, the optical compensation layer OCL_b, a first inorganic layer IML1_b, and a second inorganic layer IML2 are sequentially disposed. In the fourth sub-region SAR2_b, the first inorganic layer IML1_b and the second inorganic layer IML2 are sequentially disposed. For example, the fourth sub-region SAR2_b includes a region in which the first inorganic layer IML1_b and the second inorganic layer IML2 are sequentially disposed and a region in which only the second inorganic layer IML2 is disposed.

The length in which the optical compensation layer OCL_b of FIG. 5B extends from the dam layer DAM in a direction opposite to the second direction DR2 is less than the length in which the optical compensation layer OCL_a of FIG. 5A extends from the dam layer DAM in a direction opposite to the second direction DR2. Accordingly, a third length $W1\_b$ of the third sub-region SAR1_b of FIG. 5B in the second direction DR2 is less than the first length $W1\_a$ of the first sub-region SAR1_a of FIG. 5A.

Conversely, a fourth length $W2\_b$ of the fourth sub-region SAR2_b of FIG. 5B in the second direction DR2 may be greater than the second length $W2\_a$ of the second sub-region SAR2_a of FIG. 5A. By increasing the length of the fourth sub-region SAR2_b in the second direction DR2, the effect of preventing external moisture and oxygen from entering into the display panel DP through the optical compensation layer OCL_b and the protective layer PTL_b may be improved.

However, the inventive concept is not limited thereto. Although not illustrated separately, the display panel DP may be formed so that the third length $W1\_b$ is less than the first length $W1\_a$ and the fourth length $W2\_b$ is equal to the second length $W2\_a$. In this case, the area of the non-display region NDA of the display panel DP and the area of the bezel region BZA of the display device DD (e.g., refer to FIG. 1) corresponding to the non-display region NDA may be made relatively small, and the area of the display region DA which provides an image IM (refer to FIG. 1) and the area of the transmission region TA corresponding thereto may be made relatively large.

Referring to FIG. 5C, the second encapsulation region ENA2 includes a fifth sub-region SAR1_c which overlaps an optical compensation layer OCL_c and a sixth sub-region SAR2_c which does not overlap the optical compensation layer OCL_c. Hereinafter, like components as those described with reference to FIGS. 5A and 5B will be denoted by like reference numerals, and redundant descriptions thereof will be omitted.

As an example of the inventive concept, a protective layer PTL_c is disposed on the capping layer CPL in the overlapping region OAR and on the second electrode layer EL2 in the exposed region EAR. As an example of the inventive concept, in the non-display region NDA, the protective layer PTL_c may be disposed on a portion of the second electrode layer EL2, the dam layer DAM, and a portion of the circuit element layer DP_CL.

The optical compensation layer OCL_c is disposed on the protective layer PTL_c. The region in which the optical compensation layer OCL_c is disposed may correspond to the region in which the protective layer PTL_c is disposed.

As an example of the inventive concept, the protective layer PTL_c, the optical compensation layer OCL_c, a first inorganic layer IML1_c, and a second inorganic layer IML2 are sequentially disposed in the fifth sub-region SAR1_c. The second inorganic layer IML2 is disposed in the sixth sub-region SAR2_c.

An end of the protective layer PTL_c, an end of the optical compensation layer OCL_c, and an end of the first inorganic layer IML_c of FIG. 5C are respectively disposed on the dam layer DAM. For example, each of the protective layer PTL_c, the optical compensation layer OCL_c, and the first inorganic layer IML_c may overlap the second dam layer DAM2 and partially overlap the first dam layer DAM1. The dam layer DAM may respectively overlap the fifth sub-region SAR1_c and the sixth sub-region SAR2_c.

Accordingly, a fifth length $W1\_c$ of the fifth sub-region SAR1_c of FIG. 5C in the second direction DR2 is less than the first length $W1\_a$ of the first sub-region SAR1_a of FIG. 5A and the third length $W1\_b$ of the third sub-region SAR1_b of FIG. 5B. Conversely, by making a sixth length $W2\_c$ of the sixth sub-region SAR2_c of FIG. 5C in the second direction DR2 greater than the second length $W2\_a$ of the second sub-region SAR2_a of FIG. 5A and the fourth length $W2\_b$ of the fourth sub-region SAR2_b of FIG. 5B, the effect of preventing external moisture and oxygen from entering into the display panel DP through the optical compensation layer OCL_c and the protective layer PTL_c may be improved.

However, the inventive concept is not limited thereto. Although not illustrated separately, the display panel DP may be formed so that the fifth length $W1\_c$ is less than the first length $W1\_a$ and the third length $W1\_b$ and the sixth length $W2\_c$ is equal to the second length $W2\_a$ or the fourth length $W2\_b$. In this case, the area of the non-display region NDA of the display panel DP and the area of the bezel region BZA of the display device DD (e.g., refer to FIG. 1) corresponding to the non-display region NDA may be made small, and the area of the display region DA which provides an image IM (e.g., refer to FIG. 1) and the area of the transmission region TA corresponding thereto may be made large.

Figure 6A:
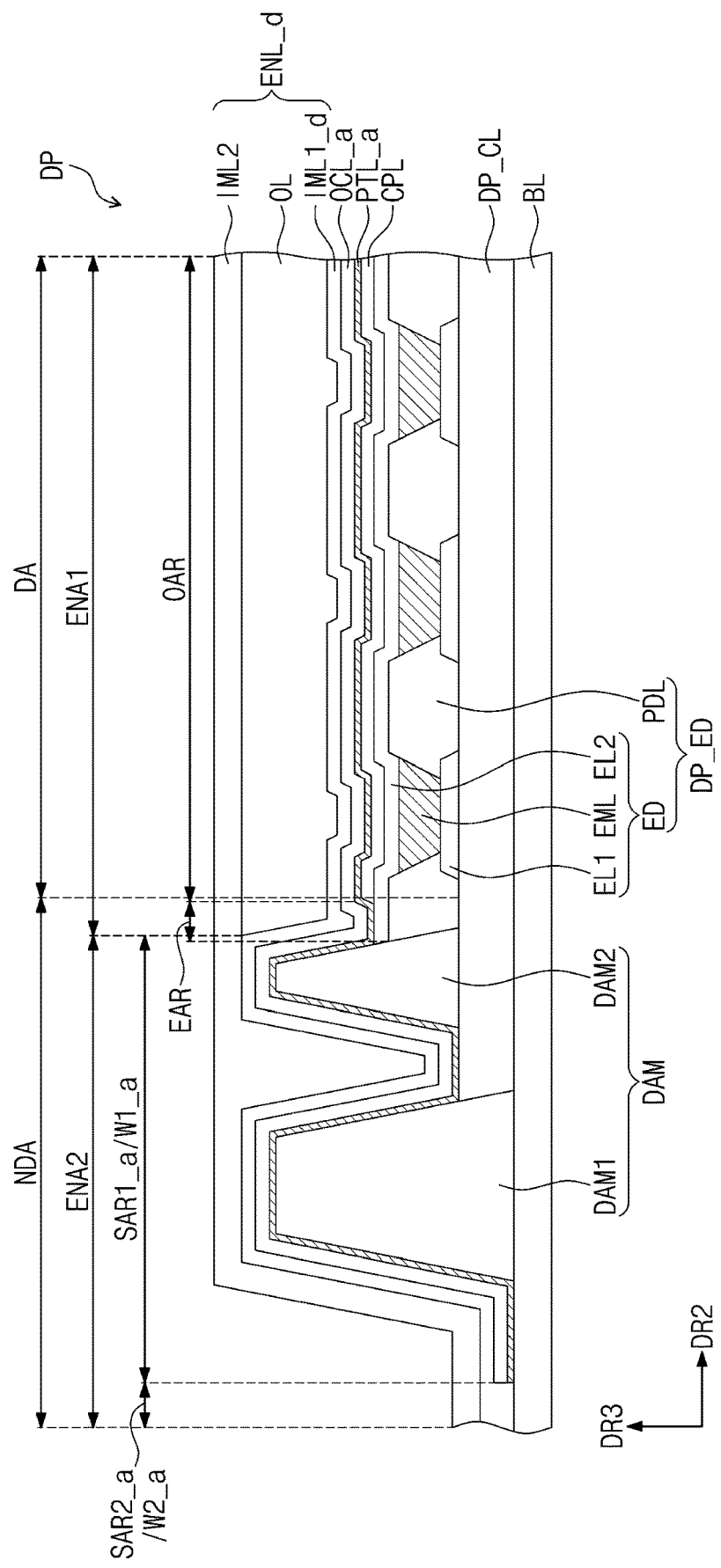
FIGS. 6A to 6C are cross-sectional views of display panels in a display region and a non-display region according to an embodiment of the inventive concept.
Figure 6B:
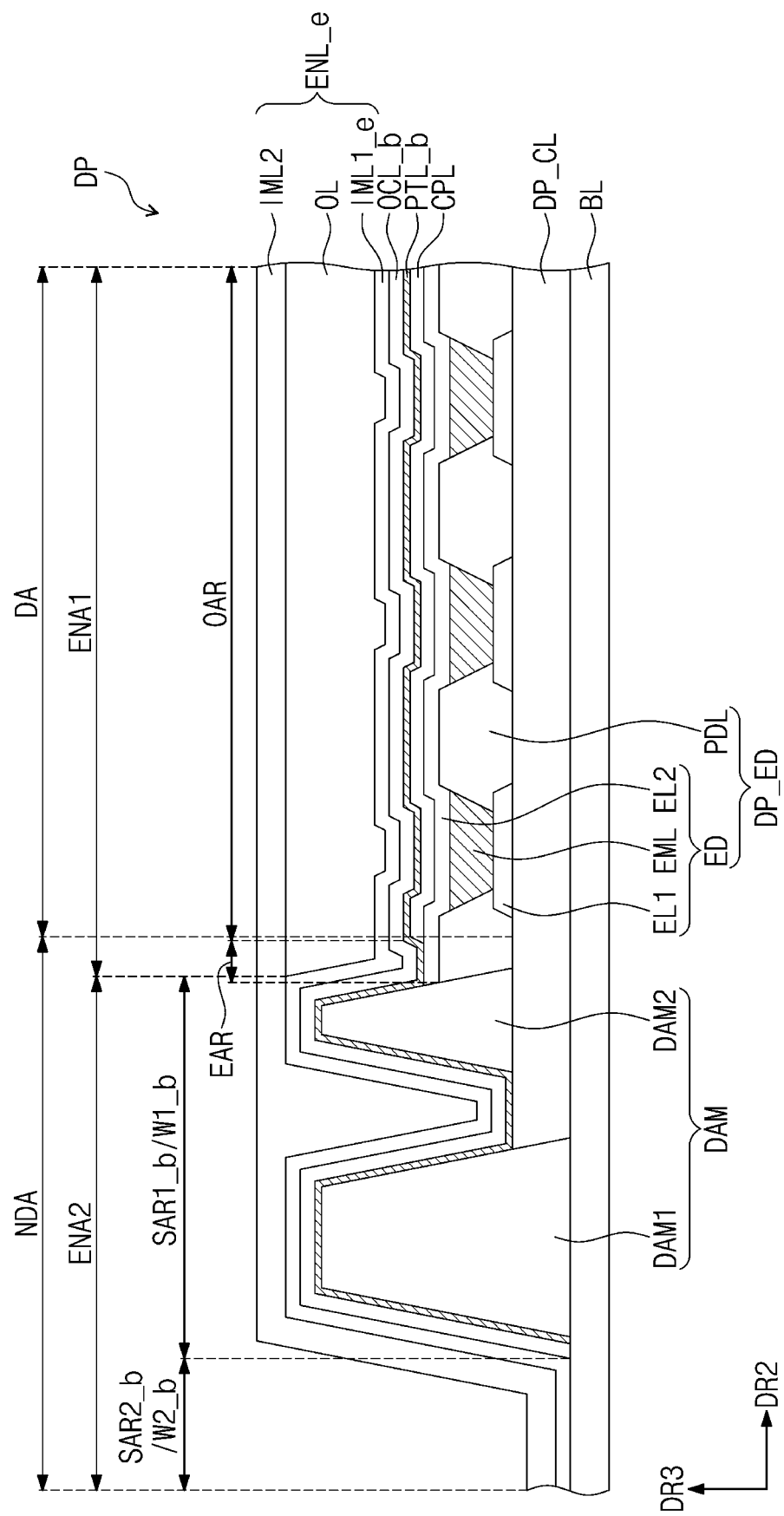
Figure 6C:
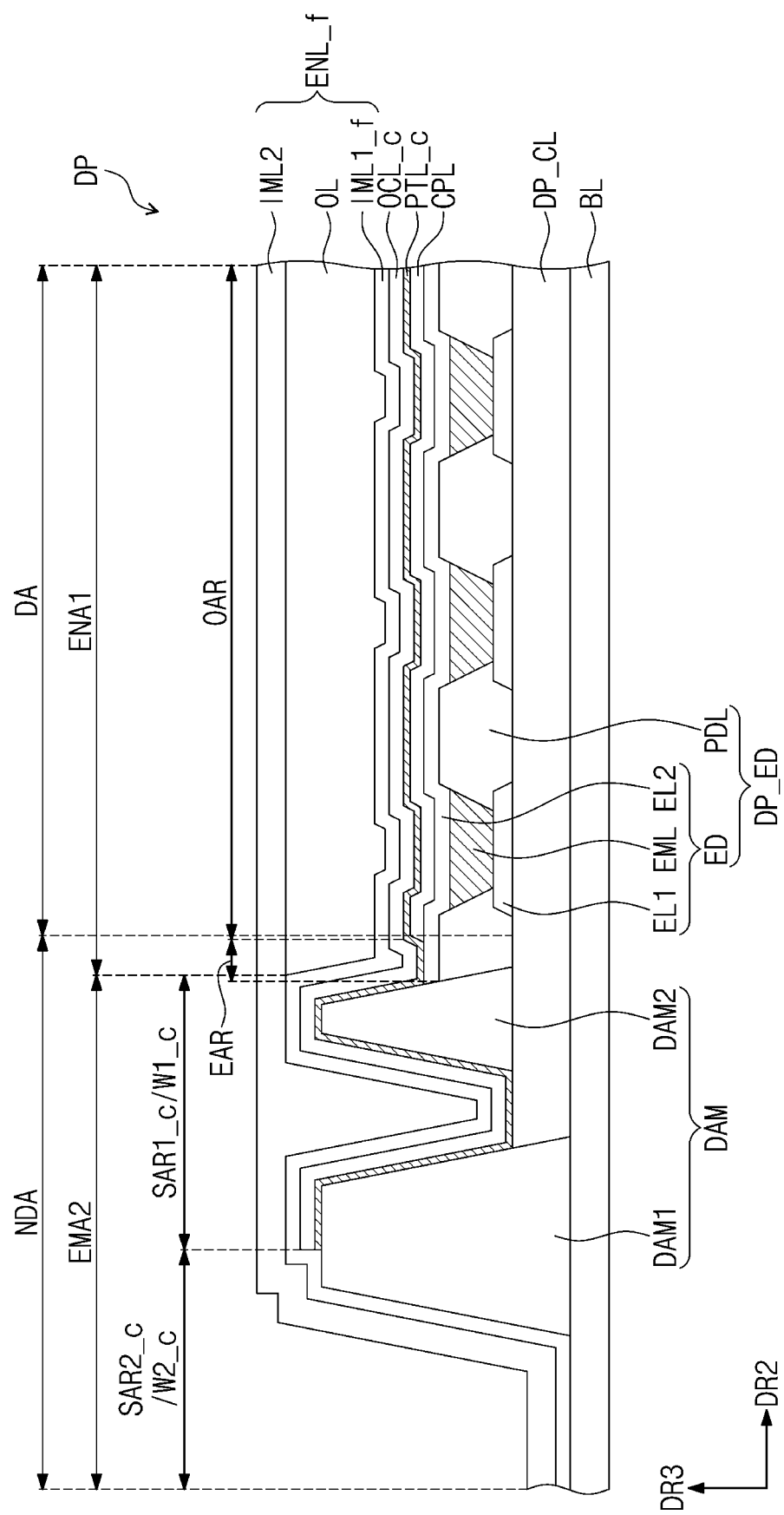

FIGS. 6A to 6C are cross-sectional views of display panels in a display region and a non-display region according to an embodiment of the inventive concept. Hereinafter, like components as those described with reference to FIGS. 5A to 5C will be denoted by like reference numerals, and redundant descriptions thereof will be omitted.

Referring to FIG. 6A, a capping layer CPL, a protective layer PTL_a, an optical compensation layer OCL_a, and an encapsulation layer ENL_d are sequentially disposed on the display element layer DP_ED.

As an example of the inventive concept, a deposition mask used to form the protective layer PTL_a may correspond to a deposition mask used to form the optical compensation layer OCL_. Accordingly, the optical compensation layer OCL_a may be disposed in the region in which the protective layer PTL_a is disposed.

The encapsulation layer ENL_d includes a first inorganic layer IML1_d disposed on the optical compensation layer OCL_a, an organic layer OL disposed on the first inorganic layer IML1_d, and a second inorganic layer IML2 disposed on the organic layer OL. A deposition mask used to form the first inorganic layer IML1_d may be different from the deposition mask used to form the protective layer PTL_a and the optical compensation layer OCL_a. In this case, the region in which the protective layer PTL_a and the optical compensation layer OCL_a are disposed may be located (or included) in the region in which the first inorganic layer IML1_d is disposed. For example, the deposition region of the first inorganic layer IML1_d may be larger or smaller than the deposition region of the protective layer PTL_a and/or the optical compensation layer OCL_a.

The encapsulation layer ENL_d includes a first encapsulation region ENA1 in which the organic layer OL is disposed and a second encapsulation region ENA2 in which the organic layer OL is not disposed.

As an example of the inventive concept, the second encapsulation region ENA2 includes a first sub-region SAR1_a which overlaps the optical compensation layer OCL_a and a second sub-region SAR2_a which does not overlap the optical compensation layer OCL_a. The protective layer PTL_a, the optical compensation layer OCL_a, the first inorganic layer IML1_d, and the second inorganic layer IML2 are sequentially disposed in the first sub-region SAR1_a. The first inorganic layer IML1_d and the second inorganic layer IML2 are sequentially disposed in the second sub-region SAR2_a. As an example of the inventive concept, the dam layer DAM overlaps the first sub-region SAR1_a and does not overlap the second sub-region SAR2_a.

Since the second inorganic layer IML2 is disposed on the first inorganic layer IML1_d in the first sub-region SAR1_a, external moisture and oxygen may be prevented from entering into the display panel DP through the organic layer OL. As the first length W1_a of the first sub-region SAR1_a increases in the second direction DR2, the effect of preventing external moisture and oxygen from entering into the display panel DP may be improved.

In the second sub-region SAR2_a, the first inorganic layer IML1_d and the second inorganic layer IML2 cover the optical compensation layer OCL_a and the protective layer PTL_a. For example, in the second sub-region SAR2_a, the first inorganic layer IML1_d directly covers the cross section of the optical compensation layer OCL_a and the cross section of the protective layer PTL_a. In the second sub-region SAR2_a, the first inorganic layer IML1_d and the second inorganic layer IML2 may prevent external moisture and oxygen from entering into the display panel DP through the optical compensation layer OCL_a and the protective layer PTL_a. As the second length W2_a of the second sub-region SAR2_a increases in the second direction DR2, the effect of preventing external moisture and oxygen from entering into the display panel DP may be improved.

Referring to FIG. 6B, the second encapsulation region ENA2 includes a third sub-region SAR1_b which overlaps an optical compensation layer OCL_b and a fourth sub-region SAR2_b which does not overlap the optical compensation layer OCL_b. Hereinafter, like components as those described with reference to FIG. 6A will be denoted by like reference numerals, and redundant descriptions thereof will be omitted.

As an example of the inventive concept, a protective layer PTL_b is disposed on the capping layer CPL in the overlapping region OAR and on the second electrode layer EL2 in the exposed region EAR. As an example of the inventive concept, in the non-display region NDA, the protective layer PTL_b may be disposed on a portion of the second electrode layer EL2, the dam layer DAM, and a portion of the circuit element layer DP_CL.

The optical compensation layer OCL_b is disposed on the protective layer PTL_b. The region in which the optical compensation layer OCL_b is disposed may correspond to the region in which the protective layer PTL_b is disposed.

As an example of the inventive concept, the protective layer PTL_b, the optical compensation layer OCL_b, a first inorganic layer IML1_e, and a second inorganic layer IML2 are sequentially disposed in the third sub-region SAR1_b. The first inorganic layer IML1_b and the second inorganic layer IML2 are sequentially disposed in the fourth sub-region SAR2_b. As an example of the inventive concept, the fourth sub-region SAR2_b includes a region in which the first inorganic layer IML1_b and the second inorganic layer IML2 are sequentially disposed and a region in which only the second inorganic layer IML2 is disposed.

The length in which the optical compensation layer OCL_b of FIG. 6B extends from the dam layer DAM in a direction opposite to the second direction DR2 is less than the length in which the optical compensation layer OCL_a of FIG. 6A extends from the dam layer DAM in a direction opposite to the second direction DR2. Accordingly, a third length W1_b of FIG. 6B is less than the first length W1_a of the first sub-region SAR1_a of FIG. 5A. Conversely, by making a fourth length W2_b of FIG. 6B greater than the second length W2_a of FIG. 6A, the effect of preventing external moisture and oxygen from entering into the display panel DP through the optical compensation layer OCL_b and the protective layer PTL_b may be improved.

However, the inventive concept is not limited thereto. Although not illustrated separately, the display panel DP may be formed so that the third length W1_b is less than the first length W1_a and the fourth length W2_b is equal to the second length W2_a. In this case, the area of the non-display region NDA of the display panel DP and the area of the bezel region BZA of the display device DD (e.g., refer to FIG. 1) corresponding to the non-display region NDA may be made relatively small, and the area of the display region DA which provides an image IM (e.g., refer to FIG. 1) and the area of the transmission region TA corresponding thereto may be made relatively large.

Referring to FIG. 6C, the second encapsulation region ENA2 includes a fifth sub-region SAR1_c which overlaps an optical compensation layer OCL_c and a sixth sub-region SAR2_c which does not overlap the optical compensation layer OCL_c. Hereinafter, like components as those described with reference to FIGS. 6A and 6B will be denoted by like reference numerals, and redundant descriptions thereof will be omitted.

As an example of the inventive concept, the protective layer PTL_c is disposed on the capping layer CPL in the overlapping region OAR and on the second electrode layer EL2 in the exposed region EAR. As an example of the inventive concept, in the non-display region NDA, the protective layer PTL_c may be disposed on a portion of the second electrode layer EL2, the dam layer DAM, and a portion of the circuit element layer DP_CL.

The optical compensation layer OCL_c is disposed on the protective layer PTL_c. The region in which the optical compensation layer OCL_c is disposed may correspond to the region in which the protective layer PTL_c is disposed.

As an example of the inventive concept, the protective layer PTL_c, the optical compensation layer OCL_c, a first inorganic layer IML1_f, and a second inorganic layer IML2 are sequentially disposed in the fifth sub-region SAR1_c. The first inorganic layer IML1_f and the second inorganic layer IML2 are sequentially disposed in the sixth sub-region SAR2_c. The first inorganic layer IML1_f may be disposed in a region which includes the second inorganic layer IML2.

An end of the protective layer PTL_c and an end of the optical compensation layer OCL_c of FIG. 6C are respectively disposed on the dam layer DAM. For example, each of the protective layer PTL_c and the optical compensation layer OCL_c may overlap the second dam layer DAM2 and partially overlap the first dam layer DAM1. The dam layer DAM may overlap the fifth sub-region SAR1_c and the sixth sub-region SAR2_c, respectively.

Accordingly, a fifth length W1_c of FIG. 6C is less than the first length W1_a of FIG. 6A and the third length W1_b of FIG. 6B. Conversely, by making a sixth length W2_c of FIG. 6C greater than the second length W2_a of FIG. 6A and the fourth length W2_b of FIG. 6B, the effect of preventing external moisture and oxygen from entering into the display panel DP through the optical compensation layer OCL_c and the protective layer PTL_c may be improved.

However, the inventive concept is not limited thereto. Although not illustrated separately, the display panel DP may be formed so that the fifth length W1_c is less than the first length W1_a and the third length W1_b and the sixth length W2_c is equal to the second length W2_a or the fourth length W2_b. In this case, the area of the non-display region NDA of the display panel DP and the area of the bezel region BZA of the display device DD (e.g., refer to FIG. 1) corresponding to the non-display region NDA may be made relatively small, and the area of the display region DA which provides an image IM (e.g., refer to FIG. 1) and the area of the transmission region TA corresponding thereto may be made relatively large.

Figure 7:
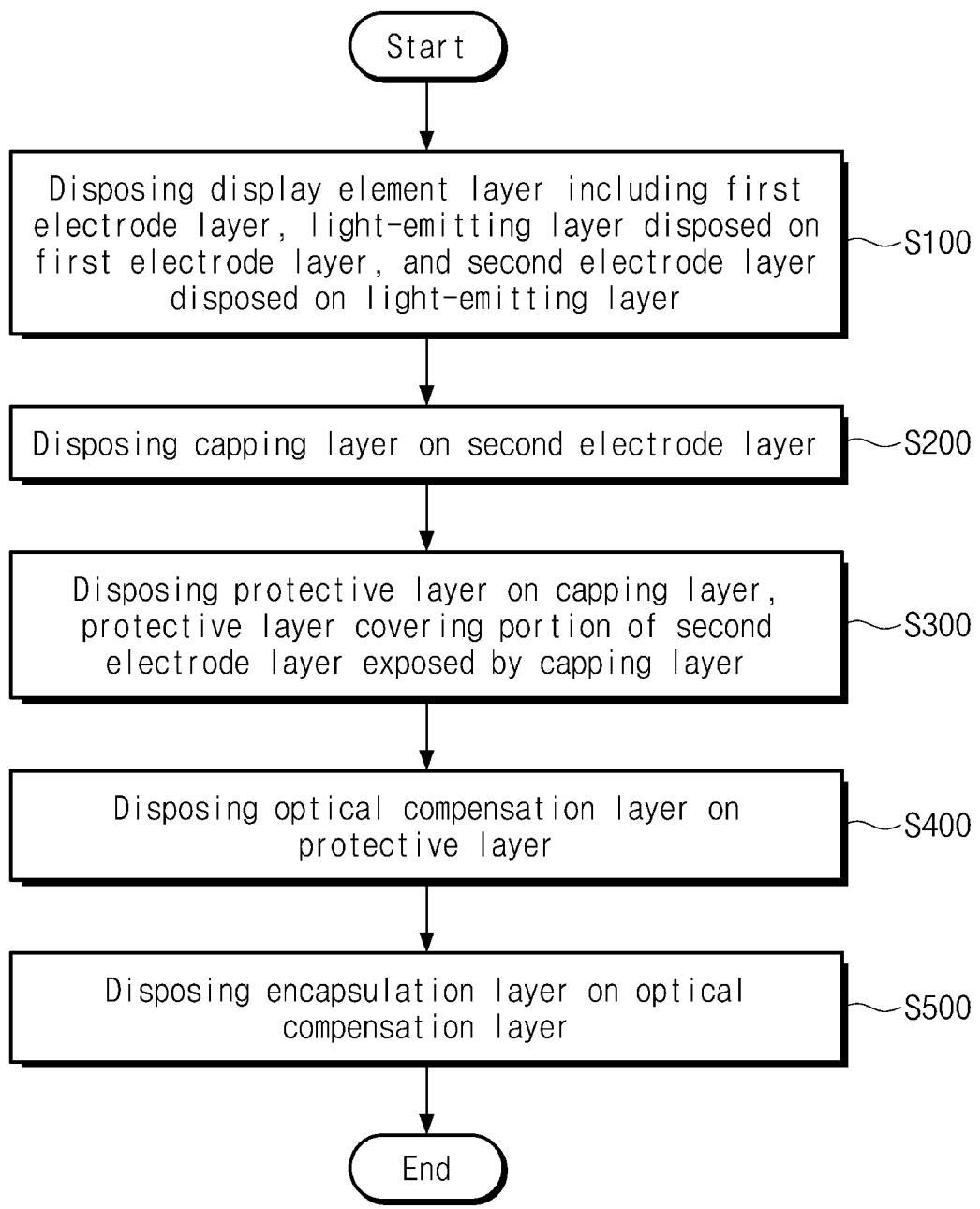
FIG. 7 is a flowchart for explaining a method of manufacturing the display device according to an embodiment of the inventive concept.
Figure 8A:
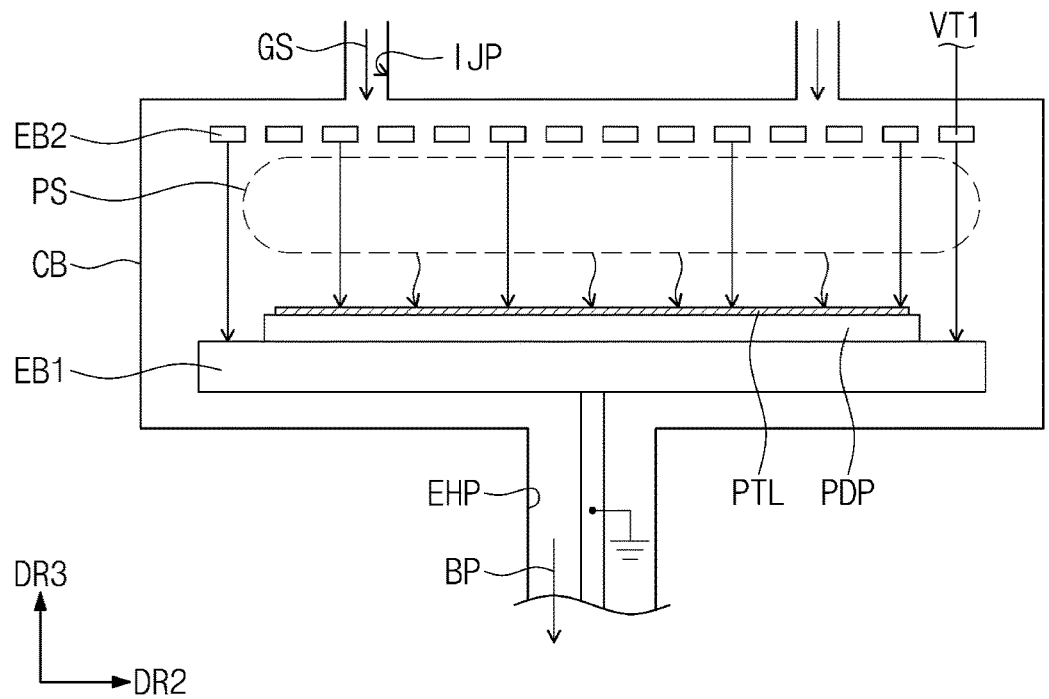
FIG. 8A is a process diagram for explaining an operation of disposing a protective layer according to an embodiment of the inventive concept.
Figure 8B:
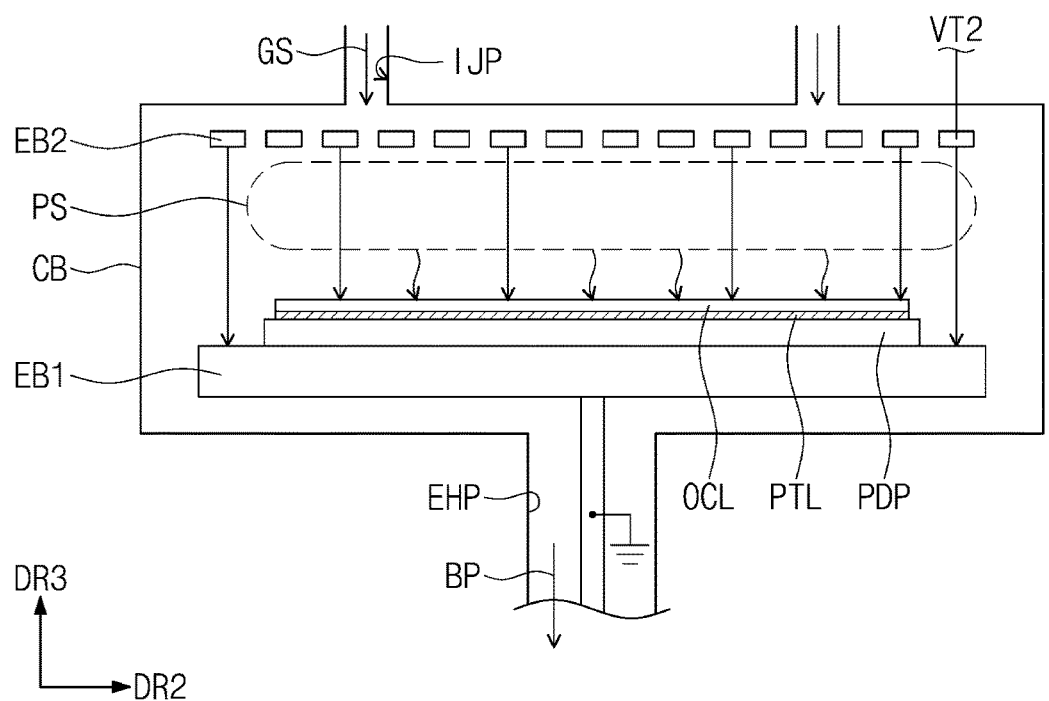
FIG. 8B is a process diagram for explaining an operation of disposing an optical compensation layer according to an embodiment of the inventive concept.
Figure 9:
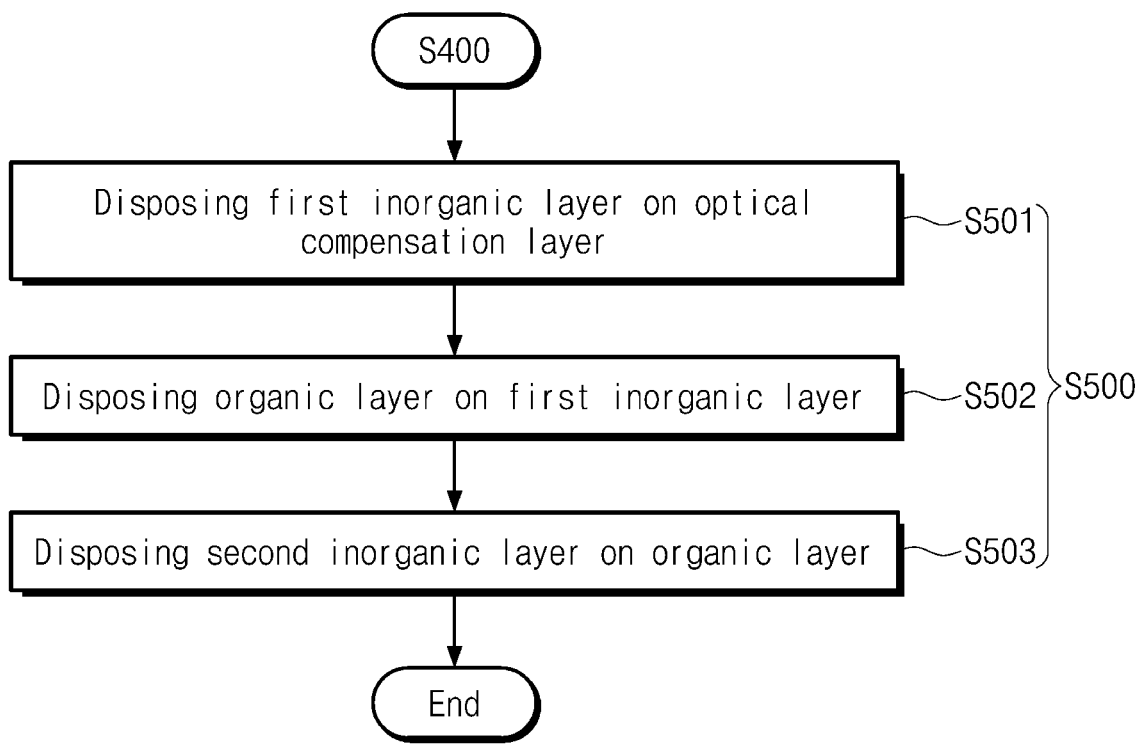
FIG. 9 is a flowchart for explaining an operation of forming an encapsulation layer on an optical compensation layer according to an embodiment of the inventive concept.

FIG. 7 is a flowchart for explaining a method of manufacturing the display device according to an embodiment of the inventive concept. FIG. 8A is a process diagram for explaining an operation of disposing a protective layer according to an embodiment of the inventive concept, and FIG. 8B is a process diagram for explaining an operation of disposing an optical compensation layer according to an embodiment of the inventive concept. FIG. 9 is a flowchart for explaining an operation of forming an encapsulation layer on an optical compensation layer according to an embodiment of the inventive concept.

Referring to FIGS. 4 and 7, the method of manufacturing the display device DD (e.g., refer to FIG. 1) includes disposing a display element layer DP_ED including a first electrode layer EL1, a light-emitting layer EML disposed on the first electrode layer EL1, and a second electrode layer EL2 disposed on the light-emitting layer (S100). As an example of the inventive concept, the display element layer DP_ED may be disposed on a base layer BL and a circuit element layer DP_CL. The method of manufacturing the display device DD includes disposing a capping layer CPL on the second electrode layer EL2 (S200).

Referring to FIGS. 4, 7, and 8A, the method of manufacturing the display device DD includes disposing a protective layer PTL on the capping layer CPL, the protective layer PTL covering a portion of the second electrode layers EL2 exposed by the capping layer CPL (S300). As an example of the inventive concept, the protective layer PTL may also cover the capping layer CPL and a portion of the second electrode layer EL2 exposed by the capping layer CPL. As an example of the inventive concept, the protective layer PTL may be disposed by a chemical vapor deposition method. As an example of the inventive concept, the protective layer PTL may be deposited by a plasma enhanced chemical vapor deposition (PECVD) method.

As an example of the inventive concept, when a substrate in which the base layer BL, the circuit element layer DP_CL, the display element layer DP_ED, and the capping layer CPL are sequentially disposed through the disposing of the display element layer DP_ED (S100) and the disposing of the capping layer CPL (S200) is referred to as a preliminary display panel PDP, the protective layer PTL may be deposited on the preliminary display panel PDP (S300).

The depositing of the protective layer PTL (S300) may be performed in a chamber CB by a plasma enhanced chemical vapor deposition method. As an example of the inventive concept, the chamber CB includes a first electrode substrate EB1, a second electrode substrate EB2, an exhaust part EHP, and an injection part IJP.

The preliminary display panel PDP is mounted on the first electrode substrate EB1. The preliminary display panel PDP may be fixed on the first electrode substrate EB1. As an example of the inventive concept, the preliminary display panel PDP may be fixed on the first electrode substrate EB1 by a vacuum suction method, an electromagnetic force method, or the like. As another example of the inventive concept, the chamber CB may further include a separate holder configured to mount the preliminary display panel PDP. In this case, the holder may be positioned on the first electrode substrate EB1.

As an example of the inventive concept, the first electrode substrate EB1 may be connected to a separate heater. The heater provides heat to the first electrode substrate EB1 and the preliminary display panel PDP disposed on the first electrode substrate EB1 so that the preliminary display panel PDP may maintain a temperature suitable for depositing the protective layer PTL and the optical compensation layer OCL on the preliminary display panel PDP.

The second electrode substrate EB2 is disposed to be spaced apart from the first electrode substrate EB1 in the third direction DR3. A plurality of holes spaced apart from each other in the second direction DR2 may be formed in the second electrode substrate EB2. A raw material gas GS, which will be described later, may be uniformly sprayed toward the preliminary display panel PDP through the holes.

As an example of the inventive concept, the first electrode substrate EB1 may be grounded. A first voltage VT1 may be applied to the second electrode substrate EB2 for a first time period. A first electric field may be formed between the first electrode substrate EB1 and the second electrode substrate EB2.

As an example of the inventive concept, the raw material gas GS for forming the protective layer PTL is injected through the injection part IJP. As an example of the inventive concept, when the protective layer PTL contains $SiO_x$, the raw material gas GS may contain gases such as $SiH_4$, $NH_3$, and $N_2O$. In this case, x which represents the composition ratio of $SiO_x$ may vary depending on the ratio of each of $SiH_4$, $NH_3$, and $N_2O$ in the raw material gas GS. As an example of the inventive concept, the raw material gas GS injected through the injection part IJP is ionized by the first electric field formed between the first electrode substrate EB1 and the second electrode substrate EB2, and assumes a plasma state. The raw material gases PS of a plasma state chemically react with each other and are deposited on the preliminary display panel PDP, to form the protective layer PTL. Thereafter, a residual gas BP, in which the remaining raw material gases PS of the plasma state which do not form the protective layer PTL are coupled to each other, is discharged outside of the chamber CB through the exhaust part EHP.

Referring to FIGS. 4, 7, and 8B, the method of manufacturing the display device DD includes disposing an optical compensation layer OCL on the protective layer PTL (S400). Hereinafter, like components as those described with reference to FIG. 8A will be denoted by like reference numerals, and redundant descriptions thereof will be omitted.

As an example of the inventive concept, the optical compensation layer OCL may be disposed by a chemical vapor deposition method. As an example of the inventive concept, the optical compensation layer OCL may be deposited by a plasma enhanced chemical vapor deposition (PECVD) method. As an example of the inventive concept, the optical compensation layer OCL may be deposited on the protective layer PTL disposed on the preliminary display panel PDP.

As an example of the inventive concept, the depositing of the optical compensation layer OCL (S400) may be sequentially performed in the chamber CB in which the protective layer PTL is deposited. However, the inventive concept is not limited thereto, and the chamber in which the protective layer PTL is deposited and the chamber in which the optical compensation layer OCL is deposited may be different from each other.

As an example of the inventive concept, a second voltage VT2 may be applied to the second electrode substrate EB2 for a second time period. A second electric field may be formed between the first electrode substrate EB1 and the second electrode substrate EB2. The second voltage VT2 is greater than the first voltage VT1. As an example of the inventive concept, the second time period for which the second voltage VT2 is applied is longer than the first time period for which the first voltage VT1 is applied. As an example of the inventive concept, when the power supplied to the chamber CB while depositing the optical compensation layer OCL is about 1000 W to about 1500 W, the power supplied to the chamber CB while depositing the protective layer PTL may be about 500 W to about 750 W. When the second time period is about 50 seconds to about 150 seconds, the first time period may be about 5 seconds to about 15 seconds. The second electric field is greater than the first electric field.

As an example of the inventive concept, the raw material gas GS for forming the optical compensation layer OCL is injected through the injection part IJP. As an example of the inventive concept, when the optical compensation layer OCL includes $SiO_x$, the raw material gas GS may contain gases such as $SiH_4$, $NH_3$, and $N_2O$. As an example of the inventive concept, the ratio of each of $SiH_4$, $NH_3$, and $N_2O$ in the raw material gas GS injected when the protective layer PTL is deposited may be equal to the ratio of each of $SiH_4$, $NH_3$, and $N_2O$ in the raw material gas GS injected when the optical compensation layer OCL is deposited.

As an example of the inventive concept, the raw material gas GS injected through the injection part IJP is ionized by the first electric field formed between the first electrode substrate EB1 and the second electrode substrate EB2, and as a result transitions to a plasma state. Raw material gases PS that are in a plasma state chemically react with each other and are deposited on the preliminary display panel PDP, to form the optical compensation layer OCL. Thereafter, a residual gas BP, in which the remaining raw material gases PS of the plasma state which do not form the optical compensation layer OCL are coupled to each other, is discharged outside of the chamber CB through the exhaust part EHP.

Referring to FIGS. 4, 7, and 9, the method of manufacturing the display device DD includes disposing an encapsulation layer ENL on the optical compensation layer OCL (S500). As an example of the inventive concept, the disposing of the encapsulation layer ENL (S500) includes disposing a first inorganic layer IML1 on the optical compensation layer OCL (S501), disposing an organic layer OL on the first inorganic layer IML1 (S502), and disposing a second inorganic layer IML2 on the organic layer OL (S503).

As an example of the inventive concept, the disposing of the first inorganic layer IML1 (S501) and the disposing of the second inorganic layer IML2 (S503) may be performed by a chemical vapor deposition method. As an example of the inventive concept, the first and second inorganic layers IML1 and IML2 may be deposited by a plasma enhanced chemical vapor deposition method. The first and second inorganic layers IML1 and IML2 may be deposited in the method used to deposit the protective layer PTL and the optical compensation layer OCL illustrated in FIGS. 8A and 8B.

In this case, when each of the first and second inorganic layers IML1 and IML2 includes $SiO_x$, x which represents the composition ratio of $SiO_x$ may vary depending on the ratio of each of $SiH_4$, $NH_3$, and $N_2O$ in the raw material gas GS. As an example of the inventive concept, as x increases, the refractive index of $SiO_x$ decreases. The refractive index of each of the first and second inorganic layers IML1 and IML2 is greater than the refractive index of the optical compensation layer OCL. Accordingly, the ratio of $N_2O$ in the raw material gas GS injected in the operation S400 of disposing the optical compensation layer OCL is greater than the ratio of $N_2O$ in the raw material gas GS respectively injected in the operations S501 and S503 of disposing the first and second inorganic layers IML1 and IML2. As an example of the inventive concept, the ratio of oxygen plasma among the gases in a plasma state which are formed in the operation S400 of disposing the optical compensation layer OCL is greater than the ratio of oxygen plasma among the gases in a plasma state which are respectively formed in the operations S501 and S503 of disposing the first and second inorganic layers IML1 and IML2.

As an example of the inventive concept, in the operation of disposing the organic layer OL on the first inorganic layer IML1 (S502), the organic layer OL may be deposited on the first inorganic layer IML1. For example, the organic layer OL may be deposited on the first inorganic layer IML1 by an inkjet printing method.

In accordance with at least one embodiment, a display device comprises a first layer disposed on a display element layer; a second layer disposed on the first layer and covering at least a portion of the display element layer; and an optical compensation layer disposed between the first layer and the second layer, wherein a refractive index of the optical compensation layer is different from a refractive index of the first layer and a refractive index of the second layer. The first layer may include a capping layer and the second layer may include an encapsulation layer. A refractive index of the optical compensation layer may be lower than a refractive index of the capping layer and a refractive index of the encapsulation layer. In addition, a protective layer may be included between the capping layer and the encapsulation layer, wherein a refractive index of the protective layer is greater than the refractive index of the optical compensation layer. The refractive index of the protective layer is lower than the refractive index of the capping layer.

According to the inventive concept, the display device includes an optical compensation layer between a capping layer and an encapsulation layer, the optical compensation layer having a refractive index lower than the refractive index of the capping layer and the refractive index of the encapsulation layer. In addition, the display device includes a protective layer between the capping layer and the optical compensation layer. The light generated in a display element layer by the above-described optical compensation layer may occur a resonance phenomenon due to constructive interference. When the optical compensation layer is formed by the above-described protective layer, it is possible to prevent the display device from being damaged. Therefore, according to the inventive concept, the external light extraction efficiency of the display device may be improved.

As described above, embodiments have been disclosed in the drawings and the specification. Although specific terms are used herein, they are used only for the purpose of describing the inventive concept and are not used to limit the meaning or scope of the inventive concept described in the claims. Therefore, those of ordinary skill in the art will understand that various modifications and other equivalent embodiments are possible therefrom. Therefore, the true technical protection scope of the inventive concept should be determined by the technical spirit of the appended claims. The embodiments may be combined to form additional embodiments.

What is claimed is:

1. A display device, comprising:
    a display element layer comprising a first electrode layer, a light-emitting layer disposed on the first electrode layer, and a second electrode layer disposed on the light-emitting layer;
    a capping layer disposed on the second electrode layer;
    a protective layer disposed on the capping layer and covering a portion of the second electrode layer exposed by the capping layer;
    an optical compensation layer disposed on the protective layer; and
    an encapsulation layer disposed on the optical compensation layer,
    wherein a refractive index of the optical compensation layer is lower than a refractive index of the protective layer.

2. The display device of claim 1, wherein:
    the refractive index of the optical compensation layer is lower than the refractive index of the capping layer and the refractive index of the encapsulation layer; and
    the refractive index of the protective layer is lower than the refractive index of the capping layer.

3. The display device of claim 1, wherein a thickness of the protective layer is less than a thickness of the optical compensation layer.

4. The display device of claim 1, wherein the encapsulation layer comprises:
    a first inorganic layer disposed on the optical compensation layer;
    an organic layer disposed on the first inorganic layer; and
    a second inorganic layer disposed on the organic layer.

5. The display device of claim 4, wherein an end of the first inorganic layer and an end of the optical compensation layer are covered by the second inorganic layer.

6. The display device of claim 4, wherein the encapsulation layer comprises:
    a first encapsulation region in which the organic layer is disposed; and
    a second encapsulation region in which the organic layer is not disposed.

7. The display device of claim 6, wherein the second encapsulation region comprises:
    a first sub-region which overlaps the optical compensation layer; and
    a second sub-region which does not overlap the optical compensation layer.

8. The display device of claim 7, wherein:
    the optical compensation layer, the first inorganic layer, and the second inorganic layer are sequentially disposed in the first sub-region; and
    only the second inorganic layer among the optical compensation layer, the first inorganic layer, and the second inorganic layer is disposed in the second sub-region.

9. The display device of claim 7, wherein:
    the optical compensation layer, the first inorganic layer, and the second inorganic layer are sequentially disposed in the first sub-region; and
    the first inorganic layer and the second inorganic layer are sequentially disposed in the second sub-region.

10. The display device of claim 7, further comprising:
    a dam layer corresponding to the first encapsulation region.

11. The display device of claim 10, wherein the dam layer overlaps the first sub-region and the second sub-region.

12. The display device of claim 10, wherein the dam layer overlaps the first sub-region and does not overlap the second sub-region.

13. A method for manufacturing a display device, the method comprising:
    disposing a display element layer comprising a first electrode layer, a light-emitting layer disposed on the first electrode layer, and a second electrode layer disposed on the light-emitting layer;
    disposing a capping layer on the second electrode layer;
    disposing a protective layer on the capping layer, the protective layer covering a portion of the second electrode layer exposed by the capping layer;
    disposing an optical compensation layer on the protective layer; and
    disposing an encapsulation layer on the optical compensation layer,
    wherein a refractive index of the optical compensation layer is lower than a refractive index of the protective layer.

14. The method of claim 13, wherein:
    the refractive index of the optical compensation layer is lower than the refractive index of the capping layer and the refractive index of the encapsulation layer; and
    the refractive index of the protective layer is lower than the refractive index of the capping layer.

15. The method of claim 14, wherein:

the disposing of the protective layer comprises depositing the protective layer on the capping layer by a plasma enhanced chemical vapor deposition method using a first voltage having a first magnitude;

the disposing of the optical compensation layer comprises depositing the optical compensation layer on the protective layer by the plasma enhanced chemical vapor deposition method using a second voltage having a second magnitude; and the first magnitude is less than the second magnitude.

16. The method of claim 15, wherein:

in the depositing of the protective layer on the capping layer, the first voltage is applied for a first time period; and in the depositing of the optical compensation layer on the protective layer, the second voltage is applied for a second time period different from the first time period.

17. The method of claim 16, wherein the first time period is shorter than the second time period.

18. The method of claim 13, wherein:

the encapsulation layer comprises a first inorganic layer disposed on the optical compensation layer, an organic layer disposed on the first inorganic layer, and a second inorganic layer disposed on the organic layer;

the disposing of the encapsulation layer comprises disposing the first inorganic layer on the optical compensation layer, disposing the organic layer on the first inorganic layer, and disposing the second inorganic layer on the organic layer; and the disposing of the optical compensation layer, the first inorganic layer, and the second inorganic layer uses a plasma enhanced chemical vapor deposition method, respectively.

19. The method of claim 18, wherein a ratio of oxygen plasma to the gases in a plasma state, which are formed in the disposing of the first and second inorganic layers, is less than a ratio of the oxygen plasma to the gases in a plasma state, which are formed in the disposing of the optical compensation layer.

20. The method of claim 18, wherein a ratio of nitrous oxide to the raw material gases used in the disposing of the first and second inorganic layers is less than a ratio of the nitrous oxide to the raw material gases used in the disposing of the optical compensation layer.

21. The method of claim 13, wherein disposing of the protective layer and the disposing of the optical compensation layer are sequentially performed in one chamber.

22. A display device comprising:

a display element layer;

a capping layer disposed on the display element layer;

a protective layer disposed on the capping layer and covering a portion of the display element layer exposed by the capping layer;

an optical compensation layer disposed directly on the protective layer; and an encapsulation layer disposed on the optical compensation layer, wherein a refractive index of the optical compensation layer is lower than a refractive index of the protective layer.

23. The display device of claim 22, wherein the refractive index of the protective layer is lower than a refractive index of the capping layer.

24. An electronic device, comprising:

a first layer disposed on a display element layer, the first layer including a capping layer disposed on the display element layer and a protective layer disposed on the capping layer and covering a portion of the display element layer exposed by the capping layer;

a second layer disposed on the first layer and covering at least a portion of the display element layer; and an optical compensation layer disposed between the first layer and the second layer, wherein a refractive index of the optical compensation layer is different from a refractive index of the first layer and a refractive index of the second layer, wherein a refractive index of the protective layer is lower than a refractive index of the capping layer.

25. The electronic device of claim 24, wherein:

the second layer includes an encapsulation layer.

26. The electronic device of claim 25, wherein a refractive index of the optical compensation layer is lower than a refractive index of the capping layer and a refractive index of the encapsulation layer.

27. The electronic device of claim 26, wherein a refractive index of the protective layer is greater than the refractive index of the optical compensation layer.

* * * * *